United States Patent
Brucker et al.

(10) Patent No.: US 9,588,004 B2
(45) Date of Patent: Mar. 7, 2017

(54) LONG LIFETIME COLD CATHODE IONIZATION VACUUM GAUGE DESIGN

(71) Applicant: MKS Instruments, Inc., Andover, MA (US)

(72) Inventors: Gerardo A. Brucker, Longmont, CO (US); Scott C. Heinbuch, Fort Collins, CO (US)

(73) Assignee: MKS Instruments, Inc., Andover, MA (US)

( * ) Notice: Subject to any disclaimer, the term of this patent is extended or adjusted under 35 U.S.C. 154(b) by 337 days.

(21) Appl. No.: 14/536,102

(22) Filed: Nov. 7, 2014

(65) Prior Publication Data
US 2016/0131548 A1 May 12, 2016

(51) Int. Cl.
| | | |
|---|---|---|
| *G01L 21/34* | (2006.01) | |
| *G01L 21/32* | (2006.01) | |
| *G01L 21/30* | (2006.01) | |
| *H05B 31/26* | (2006.01) | |
| *H01J 37/04* | (2006.01) | |
| *H01J 41/02* | (2006.01) | |
| *H01J 41/06* | (2006.01) | |
| *H01J 41/00* | (2006.01) | |

(Continued)

(52) U.S. Cl.
CPC .............. *G01L 21/34* (2013.01); *G01L 21/30* (2013.01); *G01L 21/32* (2013.01); *H01J 37/04* (2013.01); *H01J 41/02* (2013.01); *H01J 41/06* (2013.01); *H01J 27/00* (2013.01); *H01J 27/02* (2013.01); *H01J 37/08* (2013.01); *H01J 41/00* (2013.01)

(58) Field of Classification Search
CPC ......... G01L 21/30; G01L 21/32; G01L 21/34; G01N 27/62; G01N 27/626; G01N 27/64; H01J 41/00; H01J 41/02; H01J 41/04; H01J 41/14; H01J 23/027; H01J 23/0275; H01J 23/033; H01J 2223/027; H01J 2223/0275; H01J 2223/033; H01J 27/00; H01J 27/02; H01J 27/026; H01J 27/028; H01J 37/04; H01J 37/08; H01J 2237/08; H01J 2237/0822; H01J 2237/0825; H01J 2237/0827; H01J 49/10; H01J 49/169
USPC ....... 324/459, 460, 462, 463, 464, 468, 470; 250/222.2, 261, 396 R, 397, 398, 423 R, 250/489, 505.1, 506.1, 515.1; 315/108, 315/111.81, 111.91
See application file for complete search history.

(56) References Cited

U.S. PATENT DOCUMENTS 3,769,537 A * 10/1973 Hofmann ................ H01J 31/02
313/157
5,568,053 A * 10/1996 Drubetsky .............. H01J 41/06
313/157
(Continued)

FOREIGN PATENT DOCUMENTS

WO  WO 2009/085165 A2   7/2009
WO  WO 2009/105506 A1   8/2009
(Continued)

*Primary Examiner* — Hoai-An D Nguyen
(74) *Attorney, Agent, or Firm* — Hamilton, Brook, Smith & Reynolds, P.C.

(57) ABSTRACT

A Long Lifetime Cold Cathode Ionization Vacuum Gauge Design with an extended anode electrode having an axially directed tip, a cathode electrode, and a baffle structure. The axially directed tip of the anode electrode can have a rounded exterior with a diameter at least 10% greater than the diameter of the anode electrode.

26 Claims, 24 Drawing Sheets

(51) Int. Cl.
*H01J 37/08* (2006.01)
*H01J 27/00* (2006.01)
*H01J 27/02* (2006.01)

(56) References Cited

U.S. PATENT DOCUMENTS

| | | | |
|---|---|---|---|
| 6,525,292 B1* | 2/2003 | Girold | H05H 1/34 |
| | | | 219/121.48 |
| 6,593,686 B1* | 7/2003 | Yui | H01J 3/02 |
| | | | 250/492.22 |
| 7,768,267 B2* | 8/2010 | Knott | G01L 21/34 |
| | | | 250/397 |
| 8,120,366 B2 | 2/2012 | Kawasaki | |
| 8,586,918 B2 | 11/2013 | Brucker et al. | |
| 8,648,604 B2 | 2/2014 | Brucker | |
| 8,686,733 B2 | 4/2014 | Brucker | |
| 8,947,098 B2 | 2/2015 | Carmichael et al. | |
| 9,316,555 B2* | 4/2016 | Enomoto | G01L 21/34 |
| 2014/0152320 A1 | 6/2014 | Brucker | |
| 2015/0091579 A1 | 4/2015 | Brucker et al. | |
| 2015/0091580 A1 | 4/2015 | Brucker et al. | |

FOREIGN PATENT DOCUMENTS

| | | |
|---|---|---|
| WO | WO 2010/033427 A1 | 3/2010 |
| WO | WO 2010/129690 A2 | 11/2010 |
| WO | WO 2013/119851 A1 | 8/2013 |
| WO | WO 2015/048664 A1 | 4/2015 |

\* cited by examiner

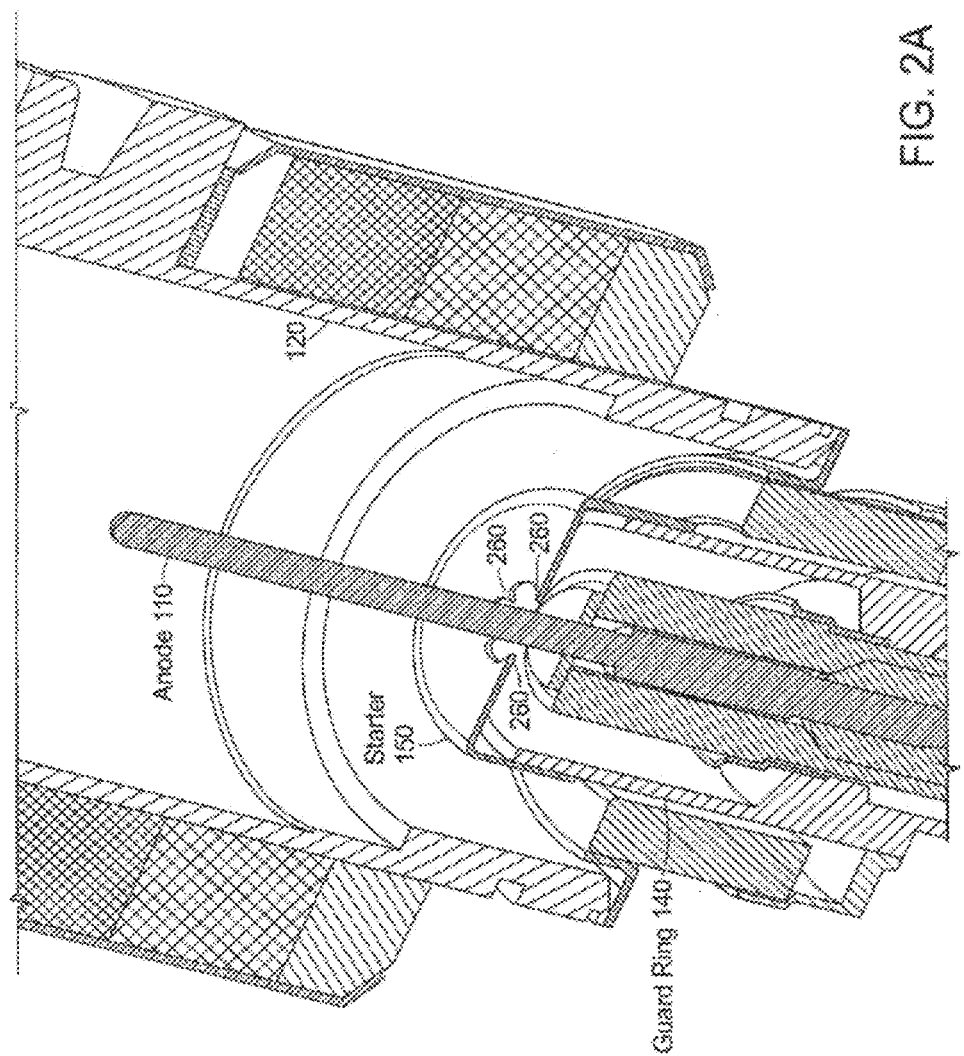

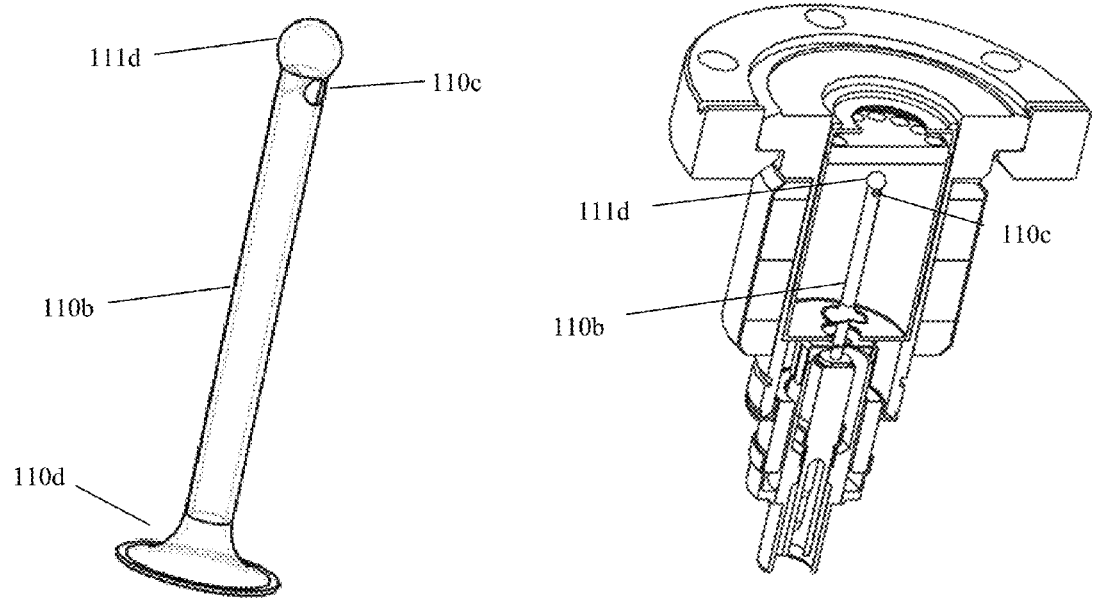
FIG. 15A
FIG. 15B
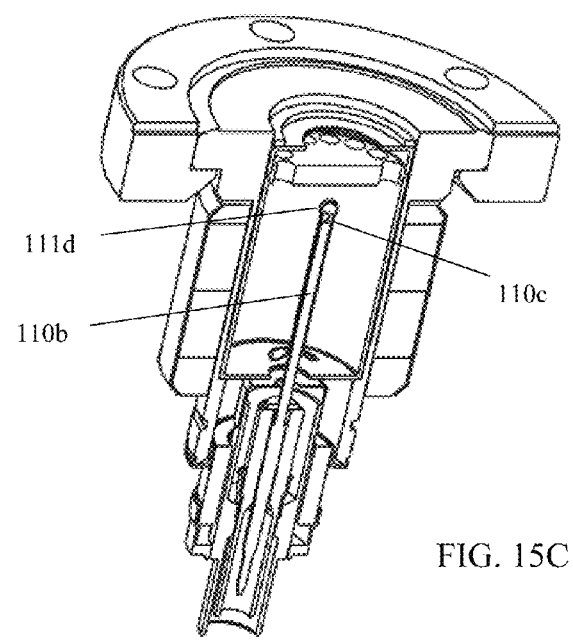
FIG. 15C

LONG LIFETIME COLD CATHODE IONIZATION VACUUM GAUGE DESIGN

BACKGROUND OF THE INVENTION

Cold cathode ionization vacuum gauges are well known. Three commonly known cold cathode ionization vacuum gauges include normal (noninverted) magnetron type gauges, inverted magnetron type gauges, and Philips (or Penning) gauges. All of these types of gauges have a pair of electrodes (i.e., an anode and a cathode) in an evacuated non-magnetic envelope which is connected to the vacuum to be measured. A high DC voltage potential difference is applied between the anode electrode and the cathode electrode to cause a discharge current to flow therebetween. A magnetic field is applied along the axis of the electrodes in order to help maintain the discharge current at an equilibrium value which is a function of pressure.

Accordingly, a cold cathode ionization vacuum gauge (CCIVG) provides an indirect measurement of vacuum system total pressure by first ionizing gas molecules and atoms inside its vacuum gauge envelope and then measuring the resulting ion current. The measured ion current is directly related to the gas density and gas total pressure inside the gauge envelope, i.e., as the pressure inside the vacuum system decreases, the measured ion current decreases. Gas specific calibration curves provide the ability to calculate total pressures based on ion current measurements.

SUMMARY OF THE INVENTION

As described herein, a cold cathode ionization vacuum gauge can include an extended anode electrode having an axially directed tip, a cathode electrode surrounding the anode electrode along at least a portion of its length and forming a discharge space between the anode electrode and the cathode electrode, and a baffle structure facing the axially directed anode electrode tip of the anode electrode. The axially directed tip of the anode electrode can have a rounded exterior with a diameter greater than the diameter of the anode electrode. The anode electrode can include a sleeve. Preferably, the diameter of the axially directed tip of the anode electrode can be at least 10% greater than the diameter of the anode electrode. Even more preferably, the diameter of the axially directed tip of the anode electrode can be at least 20% greater than the diameter of the anode electrode. Even more preferably, the diameter of the axially directed tip of the anode electrode can be at least 50% greater than the diameter of the anode electrode. The anode electrode can have a diameter of about 0.062 inches and the axially directed tip has a diameter of about 0.094 inches. The baffle structure can have an electrically nonconductive surface that minimizes discharge between the anode electrode tip and the baffle structure. The baffle structure can be ceramic or coated with a ceramic. The anode electrode tip can have a substantially dome-shaped exterior or a substantially spherical exterior. Preferably, there is no electrical discharge between the anode electrode tip and the baffle. The anode electrode tip can have an electrically nonconductive surface that minimizes discharge between the anode electrode tip and the baffle structure. The anode electrode tip can be ceramic or coated with a ceramic.

As described herein, a method of minimizing electrical discharge between an anode electrode and a baffle structure in a cold cathode ionization vacuum gauge can include providing an anode electrode tip to an extended anode electrode of a cold cathode ionization vacuum gauge. The anode electrode tip can have a rounded exterior with a diameter greater than the diameter of the anode electrode. The anode electrode tip can include a tip portion of an anode electrode sleeve. Preferably, the diameter of the axially directed tip of the anode electrode can be at least 20% greater than the diameter of the anode electrode. Even more preferably, the diameter of the axially directed tip of the anode electrode can be at least 20% greater than the diameter of the anode electrode. Even more preferably, the diameter of the axially directed tip of the anode electrode can be at least 50% greater than the diameter of the anode electrode. The anode electrode can have a diameter of about 0.062 inches and the axially directed tip has a diameter of about 0.094 inches. The anode electrode tip can have a substantially dome-shaped exterior or a substantially spherical exterior. The anode electrode tip can have an electrically nonconductive surface. The anode electrode tip can be ceramic or coated with a ceramic.

The inventors have determined, through failure mode testing, that electrical discharge between an anode electrode tip and a baffle structure can yield inaccurate pressure measurements, reduce time-to-time repeatability, and reduce gauge-to-gauge reproducibility. The electrical discharge between the anode electrode tip and the baffle structure can also contribute to the accumulation of sputtered deposits, which can negatively impact the accuracy of the pressure measurement.

The axially directed tip of the anode electrode having a rounded exterior with a diameter greater than the diameter of the anode electrode can reduce electrical discharge between the anode electrode tip and the baffle structure. Preferably, electrical discharge between the anode electrode and the baffle contributes less than 10% of the gauge inaccuracy. For example, for a gauge having ±30% accuracy, discharge between the anode electrode and the baffle contributes less than 3% inaccuracy to the pressure reading. In particular, since the sensitivity of the gauge decreases at higher pressures, electrical discharge between the anode electrode and the baffle should be minimized in order to improve the accuracy of the gauge at high pressure. In some embodiments, electrical discharge occurs substantially entirely between the anode electrode and the cathode electrode with substantially no electrical discharge between the anode electrode tip of the anode electrode or sleeve and the baffle structure.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 2A is a cross-sectional perspective view of the starter device for a cold cathode ionization vacuum gauge.

FIG. 15A is a schematic view of an anode electrode sleeve having a sphere-shaped tip.

FIG. 15B is a schematic view of an anode electrode having a sleeve with a sphere-shaped tip in a CCIVG.

FIG. 15C is a cross section of an anode electrode having a sleeve with sphere-shaped tip in a CCIVG.

DETAILED DESCRIPTION OF THE INVENTION

Design and Operation of a CCIVG

A description of an example cold cathode ionization vacuum gauge follows.

A cold cathode ionization vacuum gauge relies on the inverted magnetron principle. The gauge is of cylindrical symmetry. A large voltage potential difference (i.e., radial electric field) between the anode pin (located at the axis) and the cathode cylindrical envelope provides energy to the electrons for the ionization events to occur. A crossed axial magnetic field provides the electron trajectory path length required to maintain a discharge inside the envelope. The discharge current is the measured quantity that is proportional to the pressure in the system.

The discharge is established through an avalanche ionization process that generally starts with a single electron being released into the ionization volume of the gauge. The process responsible for releasing an electron can include a field emission event or a cosmic ray ionization process. The avalanche process relies on the long path length for the electron trajectories that leads to many ionization processes per electron. Each ionization process releases an ion as well as an additional electron that is added into the discharge. As the ions collide with the cathode internal walls, additional electrons are also released into the discharge, thereby contributing to the total charge. The electrical discharge consisting of ions and electrons reaches an ion density that is proportional to the pressure in the system.

The cold cathode ionization vacuum gauge described herein relies on the double inverted magnetron principle introduced by Drubetsky in 1995. See U.S. Pat. No. 5,568,053. The double inverted magnetron design, shown in FIG. 1A, includes two magnets held together in a magnet assembly, the two magnets having their magnetic poles opposed to one another. The double inverted magnetron features some of the largest magnetic fields, and, as a result, provides the largest gauge sensitivities available. Large gauge sensitivities are required to be able to read reliable pressures at UHV levels (i.e., pressures less than about $10^{-9}$ Torr). One example of a CCIVG is described in U.S. patent application Ser. No. 14/500,820, the entirety of which is incorporated herein by reference.

Figure 1A:
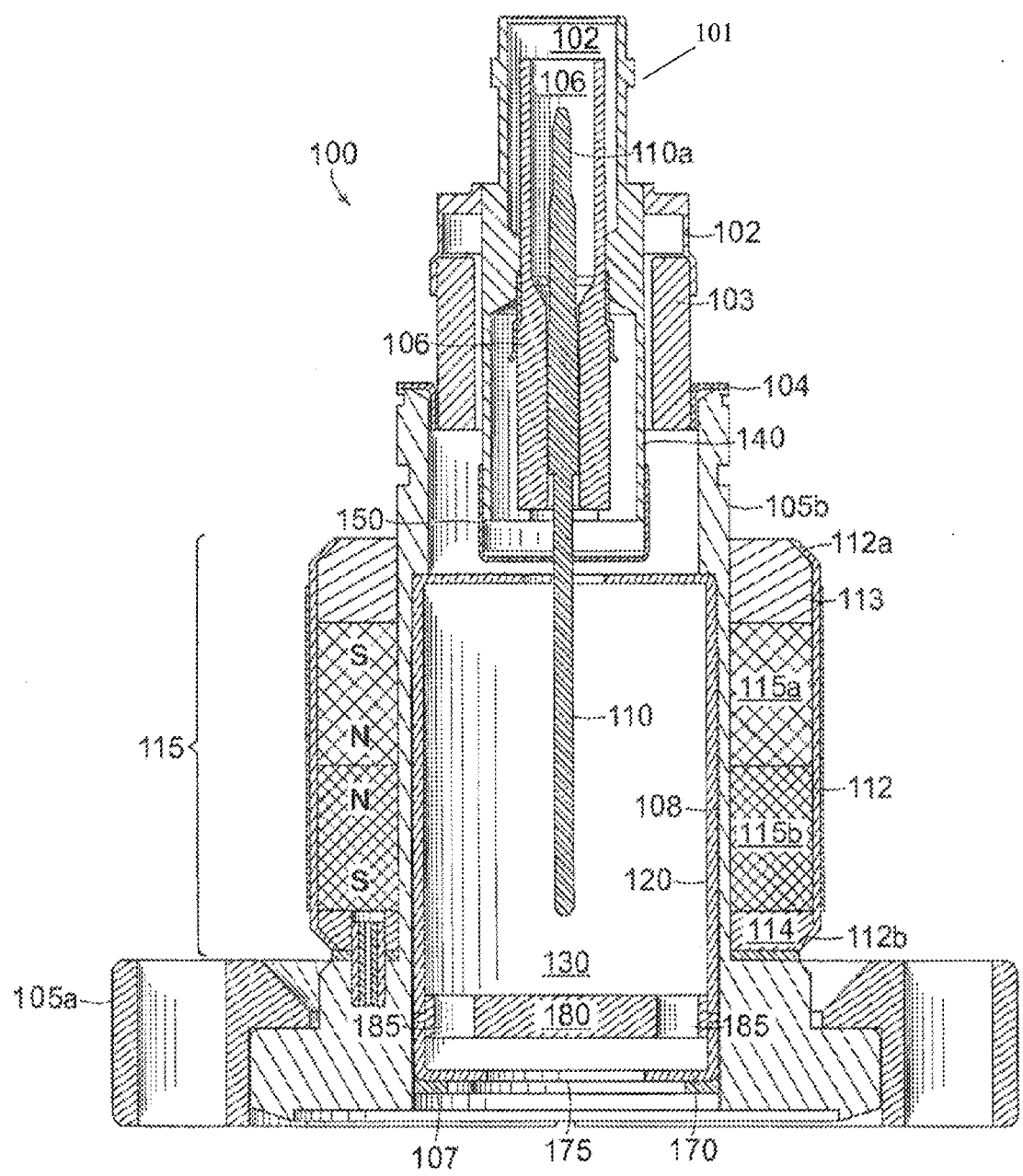
FIG. 1A is a cross-sectional illustration of a cold cathode ionization vacuum gauge.
Figure 1B:
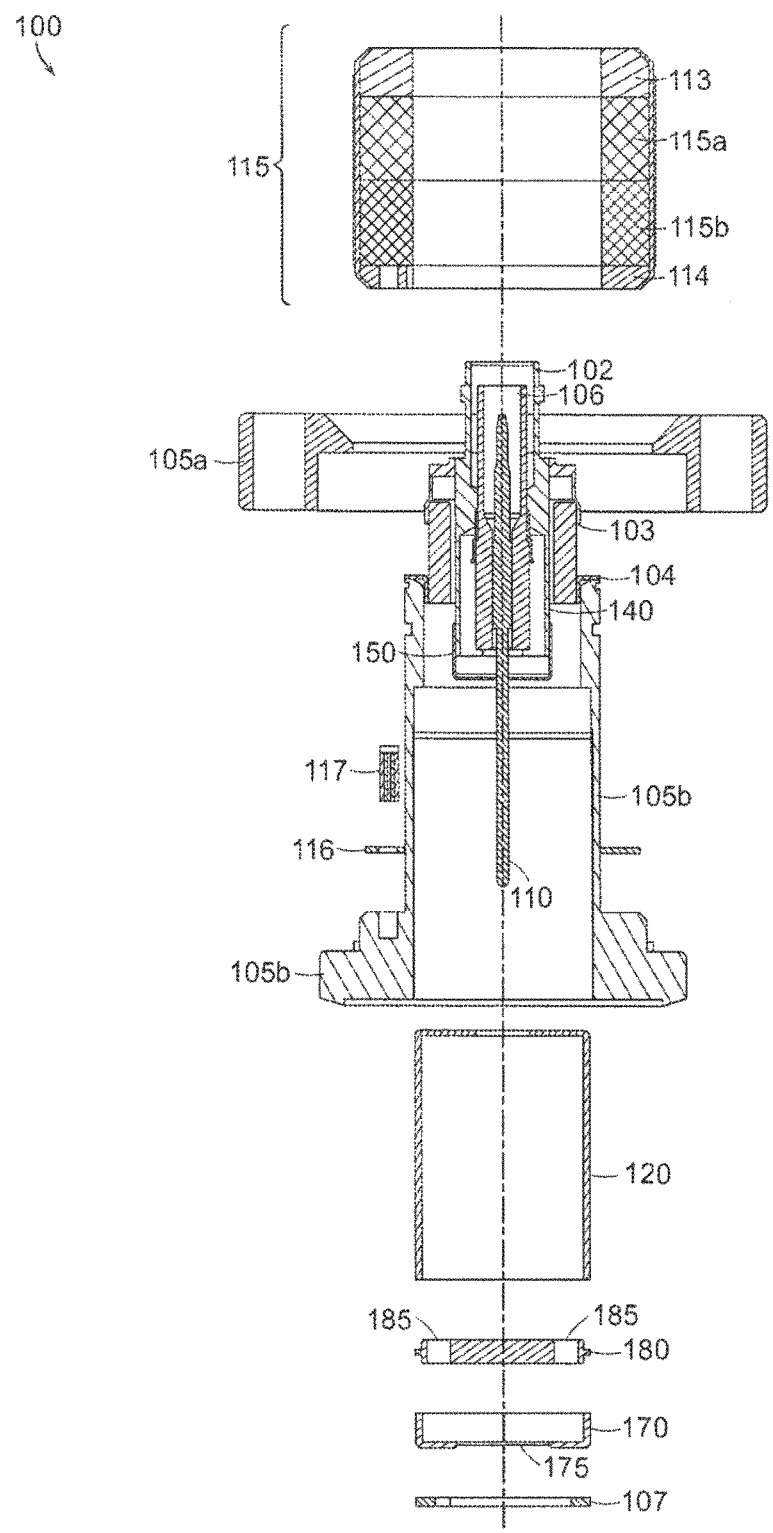
FIG. 1B is an exploded cross-sectional view of the component parts of a cold cathode ionization vacuum gauge.
Figure 1C:
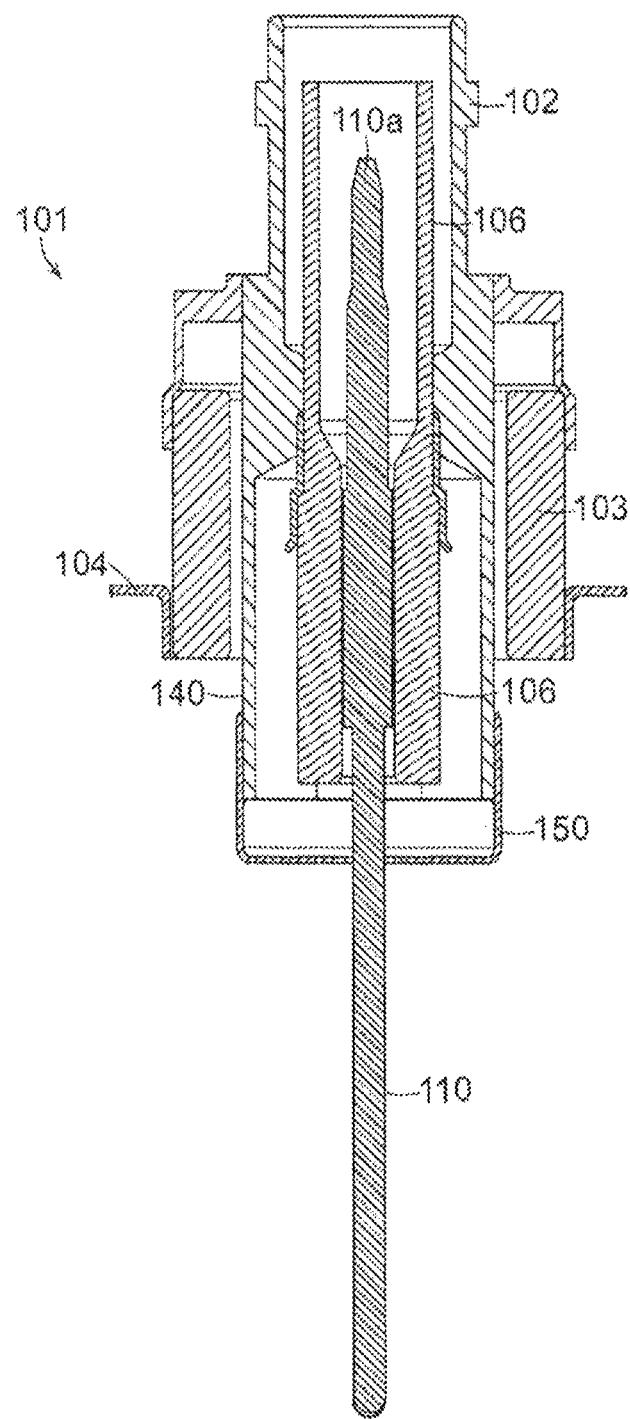
FIG. 1C is a cross-sectional view of the component parts of a SHV feedthrough of a cold cathode ionization vacuum gauge.
Figure 1D:
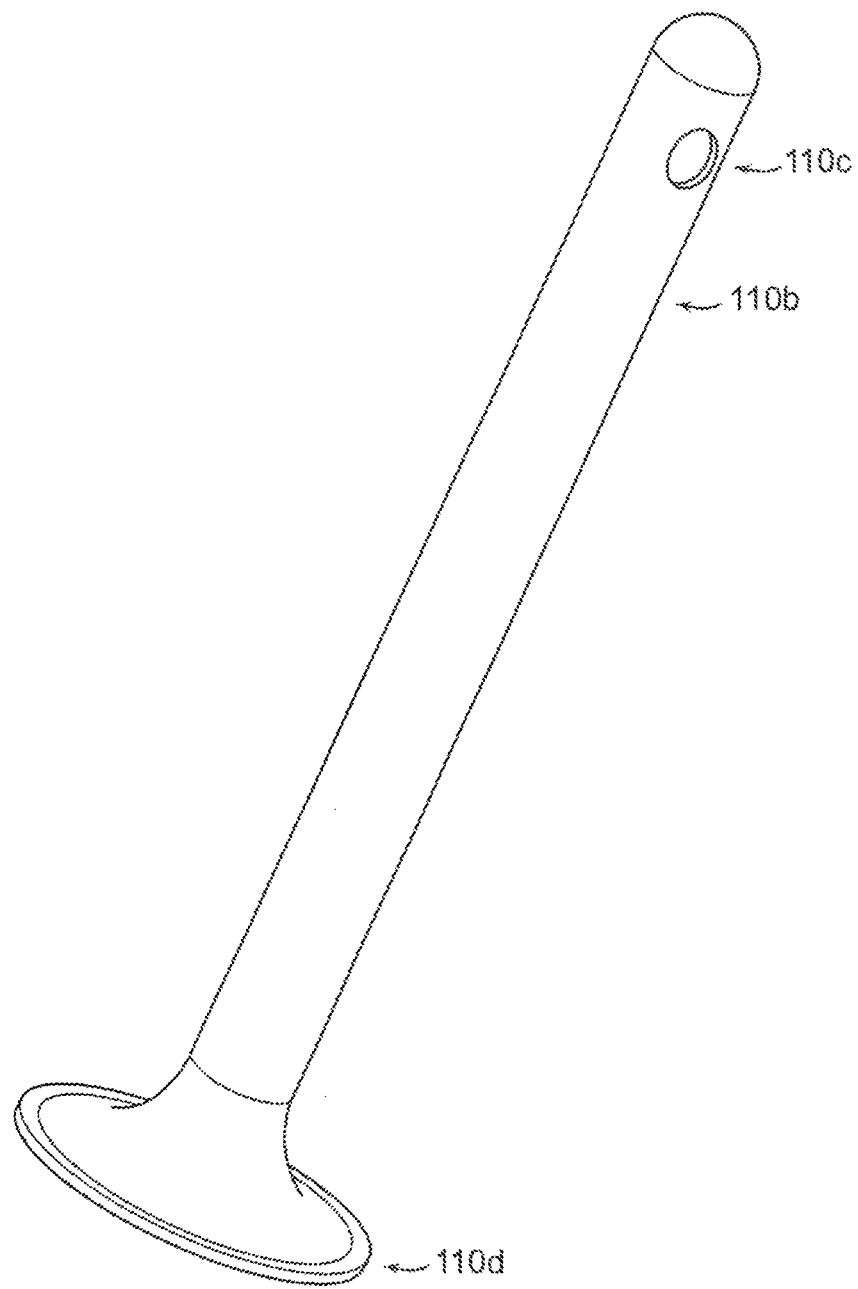
FIG. 1D is an illustration of an optional anode sleeve.
Figure 1E:
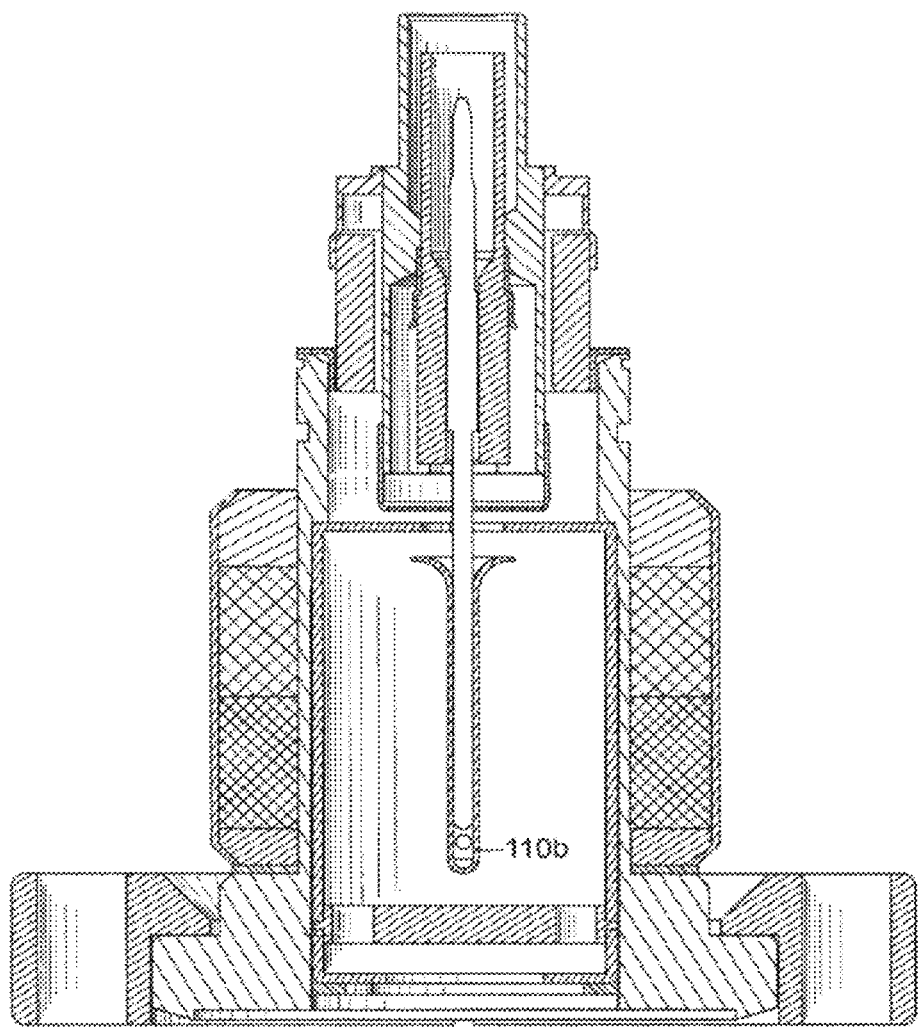
FIG. 1E is a cross-sectional illustration of a cold cathode ionization vacuum gauge with an optional anode sleeve.
Figure 1F:
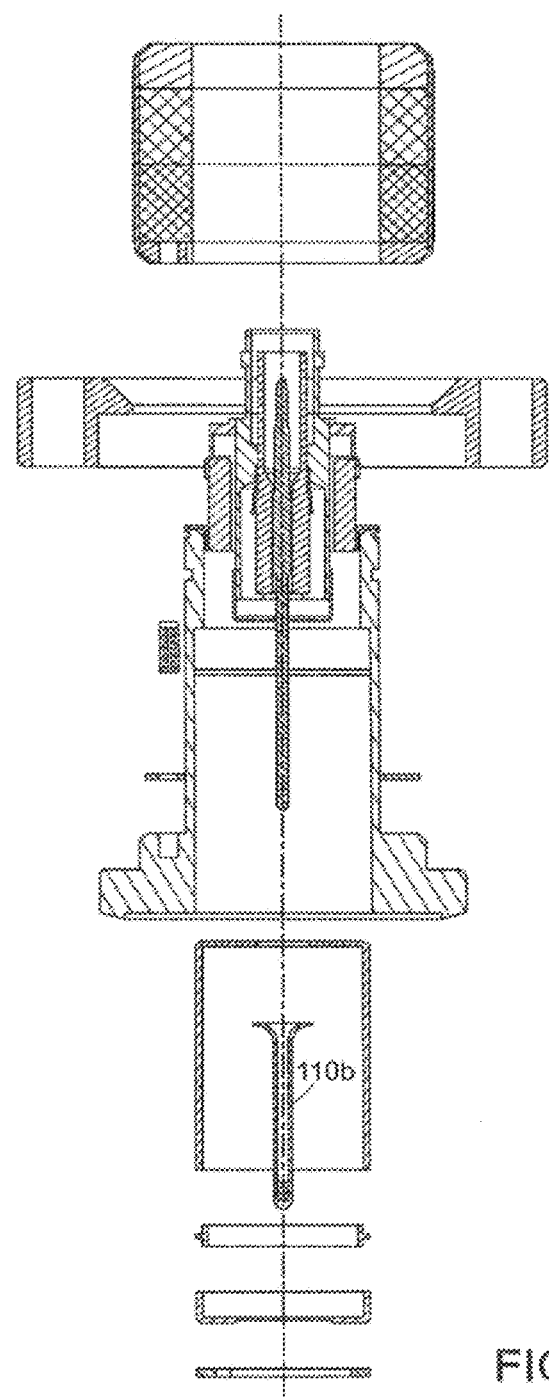
FIG. 1F is an exploded cross-sectional view of the component parts of a cold cathode ionization vacuum gauge with an optional anode sleeve.

Accordingly, as shown in FIGS. 1A, 1B, and 1C, a cold cathode ionization vacuum gauge 100 includes a floating SHV (safe high voltage) stainless steel cylindrically symmetric feed through 101, shown in FIG. 1C separately from the rest of the vacuum gauge 100, that includes a guard ring BNC style connection 102 that provides electrical connection to a guard ring electrode 140 described below. Inside the guard ring connection 102, an anode guard ring insulator 106 provides electrical insulation around an anode connection 110a to an extended anode electrode 110. The guard ring electrode 140 is connected to a starter device 150, which is described below. The guard ring connection 102 is connected by a cathode-guard ring insulator 103 to a weld surface 104, which is seam welded to a monolithic flange assembly 105. As shown in FIGS. 1A and 1B, the monolithic flange assembly 105 includes outer flange 105a and inner flange 105b. The inner flange 105b encloses a cathode electrode 120 surrounding the anode electrode 110 along at least a portion of its length and forming a discharge space 130 between the anode electrode 110 and the cathode electrode 120. A baffle, described below and shown in FIGS. 1A and 1B has two partitions 170 and 180 having apertures 175 and 185, respectively, is connected to the cathode electrode 120. As shown in FIG. 1B, the cathode electrode 120 and baffle partitions 170 and 180 are removable from inner flange 105b, enabling refurbishing of the vacuum gauge 100. The cathode electrode 120 and baffle partitions 170 and 180 are retained inside inner flange 105b by a snap ring 107. A refurbishing kit for vacuum gauge 100 can include a replacement cathode 120 and baffle partitions 170 and 180, and, optionally, an anode sleeve 110b, shown in FIGS. 1D, 1E and 1F, that covers the surface of anode electrode 110, thereby replacing or covering the surfaces that are subject to sputtering or deposition during operation of the vacuum gauge 100. To aid in evacuation of the vacuum gauge 100 after replacement of the cathode 120, a small gap 108, shown in FIG. 1A, is provided between the cathode 120 and the inner flange 105b. The gap 108 terminates at the end of the cathode 120 close to the guard ring electrode 140, in order to provide proper alignment of the cathode 120 with the guard electrode 140 and anode electrode 110.

The removable and replaceable anode sleeve 110b may be a thin walled tube that slides onto the anode post 110, providing electrical connection to the anode post and shielding the post surface from contamination build-up. The anode sleeve 110b may simply be held in place with a friction fit. The anode sleeve 110b may also include a hole 110c on the top end that can be used to hook the sleeve in order to pull it out of the gauge structure. The bottom end of the anode sleeve 110b may include a flare 110d. The anode sleeve flare 110d can inhibit deposits from falling into the starter device 150.

Once a gauge shows signs of contamination, it should be possible to quickly and easily clean the contaminated areas of the gauge and restore it to a fully functional condition. The anode in a CCIVG, that is, the anode sleeve 110b in this configuration, is expected to build a layer of hydrocarbon or silicone contaminants very quickly in a vacuum system. In other words, the anode can be simply an anode post 110 alone or an anode post 110 in combination with an anode sleeve 110b. A removable anode sleeve 110b can be used in CCIVGs to protect and shield the anode post 110 from contamination build up during the operation of the gauge. Used in combination with the removable cathode 120, it provides a fast and easy method of field servicing a CCIVG and a CCIVG user is able to restore the entire gauge in a matter of a few minutes. This method of servicing a CCIVG has several advantages over previous methods. Using a removable and replaceable anode sleeve 110b and cathode eliminates the need to use abrasive materials to clean the anode post and cathode once they are contaminated. Abrasive cleaners may abrade away too much material from the internal surfaces of the gauge and significantly impact their mechanical and chemical characteristics. With a removable sleeve 110b and cathode 120, the contaminated surfaces can be easily removed and replaced with a clean set. The contaminated cathode cage and the anode sleeve do not have to be cleaned by means of abrasive treatments. In most cases, the cleaning can be done in an ultrasonic cleaner with the help of proper chemicals. One way to eliminate hydrocarbon build up on the anode post is to use alkaline cleaners such as a concentrated solution of NaOH followed by a rinsable cleaning solution. Using a removable anode sleeve 110b and cathode 120 reduces the possibility of affecting the concentric alignment between the anode and the cathode because the gauge does not need to be fully disassembled. The maintenance cost is minimal. A user with access to an extra anode sleeve/cathode combination can quickly do a swap each time maintenance is required.

As discussed above, a crossed axial magnetic field provides the electron trajectory path length required to maintain a discharge inside the discharge space 130. The magnetic field is created by magnet assembly 115, shown in FIGS. 1A and 1B, which includes two Samarium Cobalt (SmCo) magnets 115a and 115b that are glued together one on top of the other with their magnetic poles opposite to one another in a double inverted (DI) configuration, and enclosed by a stainless steel cylinder 112 whose ends 112a and 112b are swaged closed, thereby confining the magnets 115a and 115b, which would otherwise repel each other due to the opposite pole configuration. The magnet assembly 115 includes a ferromagnetic spacer 114, which connects the magnet assembly 115 to the inner flange 105b by the aid of a locating pin 117 pressed into the inner flange 105b, and a magnetic coupler 116 (shown as a ferromagnetic ring 116 in FIG. 1B). The magnetic coupler 116 is spot welded to the inner flange 105b. The magnet assembly 115 is slidably connected to the inner flange 105b at a location with respect to cathode electrode 120 that locates the electrical discharge inside discharge space 130. The magnet assembly 115 can also include an aluminum (or other non-magnetic material) spacer 113 at the end of the magnet assembly closest to the guard ring 140 to adjust the location of the electrical discharge away from the guard ring 140.

The electrically conductive guard ring electrode 140 is interposed between the cathode electrode 120 and the anode electrode 110 about a base of the anode electrode 110 to collect leakage electrical current that would otherwise tend to flow between the anode electrode 110 and the cathode electrode 120 if electrically conductive deposits accumulate over time on surfaces of the cathode-guard ring insulator 103 exposed to the discharge space 130 during operation of the vacuum gauge 100.

Figure 2B:
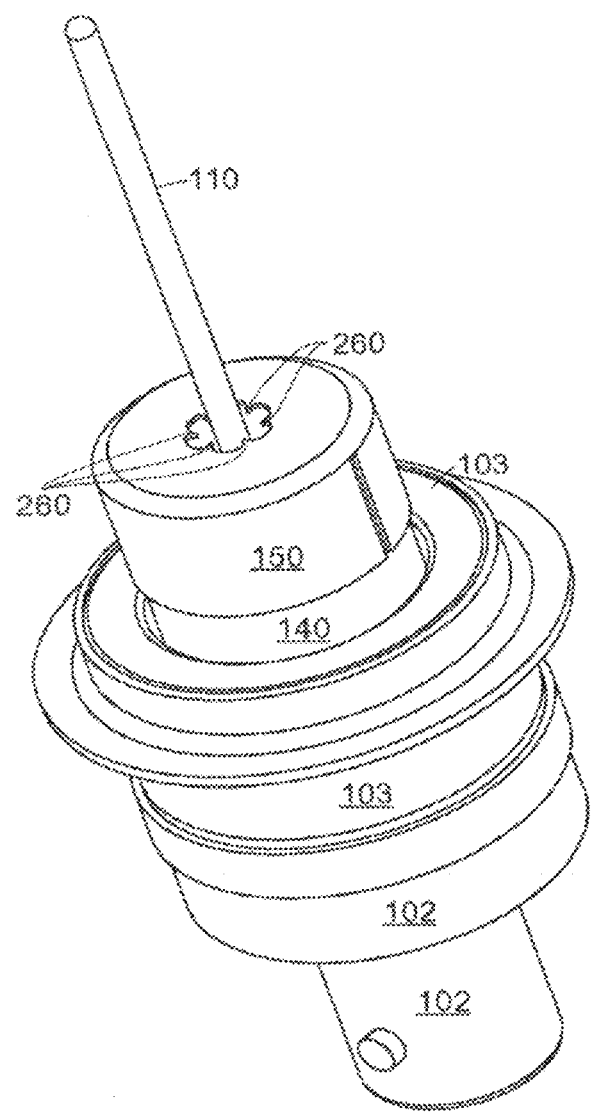
FIG. 2B is a perspective view of the starter device for a cold cathode ionization vacuum gauge.
Figure 2C:
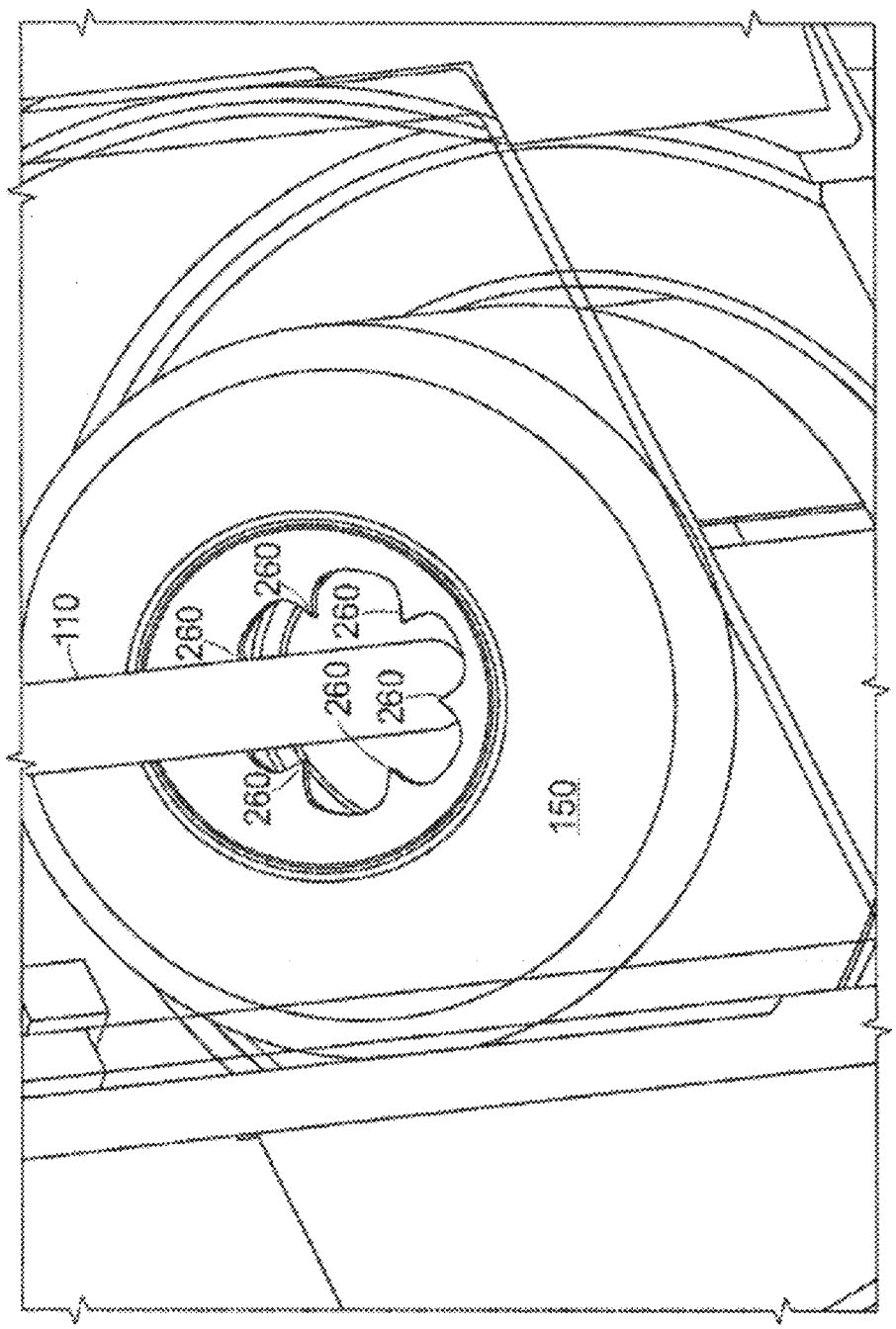
FIG. 2C is a bottom view of the starter device for a cold cathode ionization vacuum gauge.

A discharge starter device 150 is disposed over and electrically connected with the guard ring electrode 140. As shown in FIG. 2A, the starter device 150 has a plurality of tips 260 (3 tips are shown in the cross-section cylindrically symmetrical view shown in FIG. 2A) directed toward the anode 110 and forming a gap between the tips 260 and the anode 110. The plurality of tips 260 can be numbered in a range of 2 tips to 8 tips, such as in a range of 5 tips to 7 tips, or 6 tips, as shown in FIG. 2C, where another view of starter device 150 shows 6 tips 260, of which one tip 260 is hidden behind anode electrode 110. The tips can be designed in various patterns, such as star bursts. See U.S. Pat. No. 8,120,366 for examples of starter tip shapes. The gap between the tips and the anode can be in a range of between about 500 μm and about 2500 μm. The gap is configured such that the field emission current during normal operation is in a range of about 1 pA to about 10 pA when a voltage potential difference between the starter device 150 and the anode 110 is established. The field emission current amplitude is dependent on several parameters, such as the voltage potential difference, the size of the gap, the number of points on the starter device, and the type of material that the starter device is made of. The starter device 150 can be made of stainless steel, tungsten, or other metal or conductive material. The voltage potential difference between the starter device and the anode, during operation of the cold cathode ionization vacuum gauge, can be in a range of about 0.4 kV to about 6 kV, such as about 3.5 kV. This voltage potential difference produces electrons by field emission from the sharp tips 260 to the anode, thereby seeding some electrons into the discharge volume 130 to trigger the avalanche process that is responsible for building up the discharge. Optionally, the voltage potential difference between the starter device and the anode can be configured to be increased from about 3.5 kV to about 5 kV during startup of the gauge, in order to increase the field emission current by increasing the high voltage supply bias to the anode electrode momentarily, until a discharge is detected by a sudden increase in the discharge current.

Figure 3:
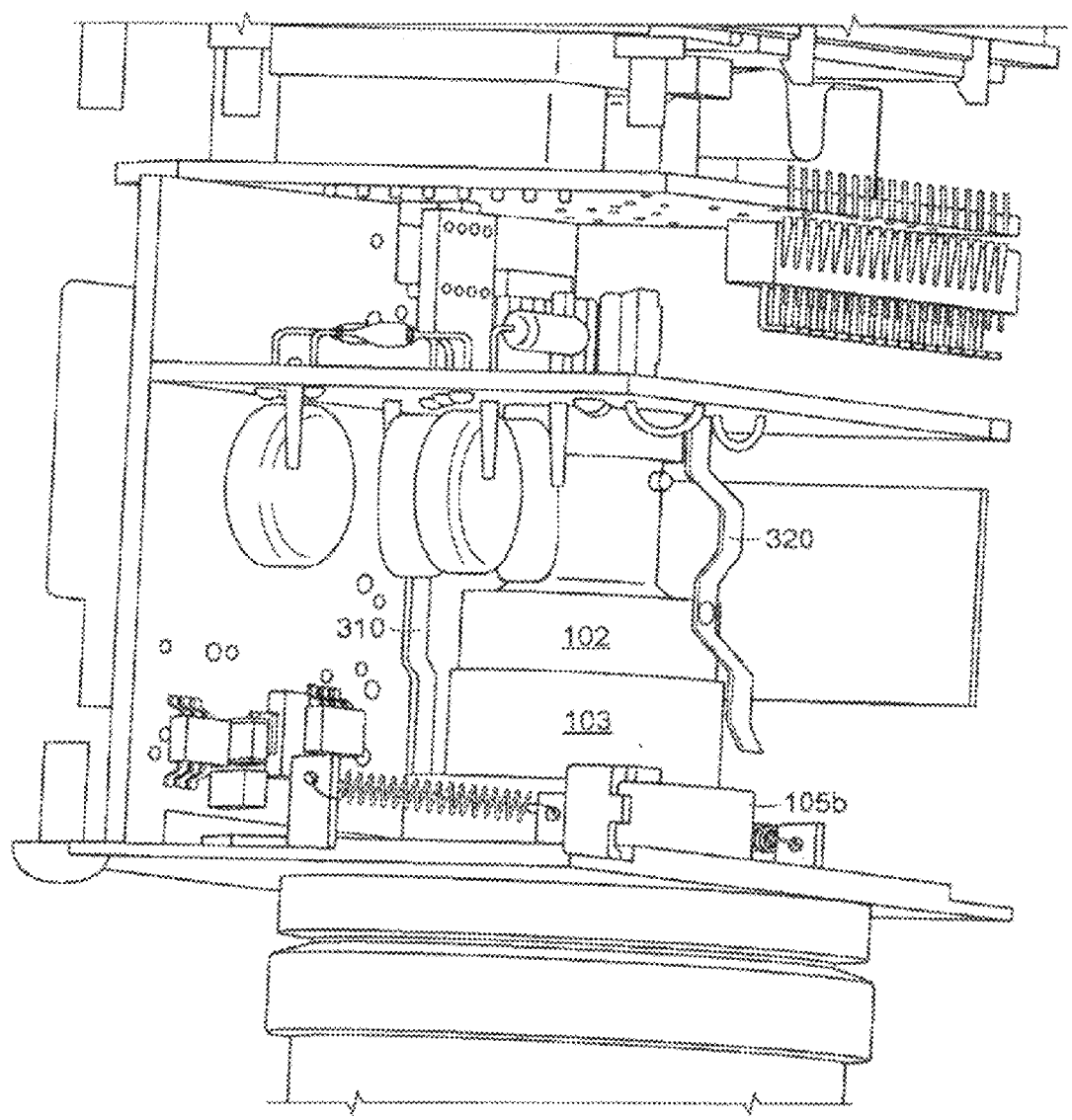
FIG. 3 is a perspective view of electrical contacts to a vacuum gauge inside an electronics module for a cold cathode ionization vacuum gauge.

During operation of the vacuum gauge 100, electrical contacts to the anode electrode 110 and guard ring electrode 140 are made by the anode connection 110a and the guard ring connection 102, respectively. Electrical contact to the cathode electrode 120, which is grounded, is made either by a spring clip 310 shown in FIG. 3, which is located inside an electronics module described below, the spring clip 310 contacting the inner flange 105b, or by a wire attached to a cable, as described below, the wire being attached to any part of the outer flange 105a (e.g., attached to a bolt that fastens the outer flange 105a to a vacuum chamber (not shown)). As also shown in FIG. 3, contact to the guard ring connection 102 inside the electronics module is made by another spring clip 320.

Figure 4:
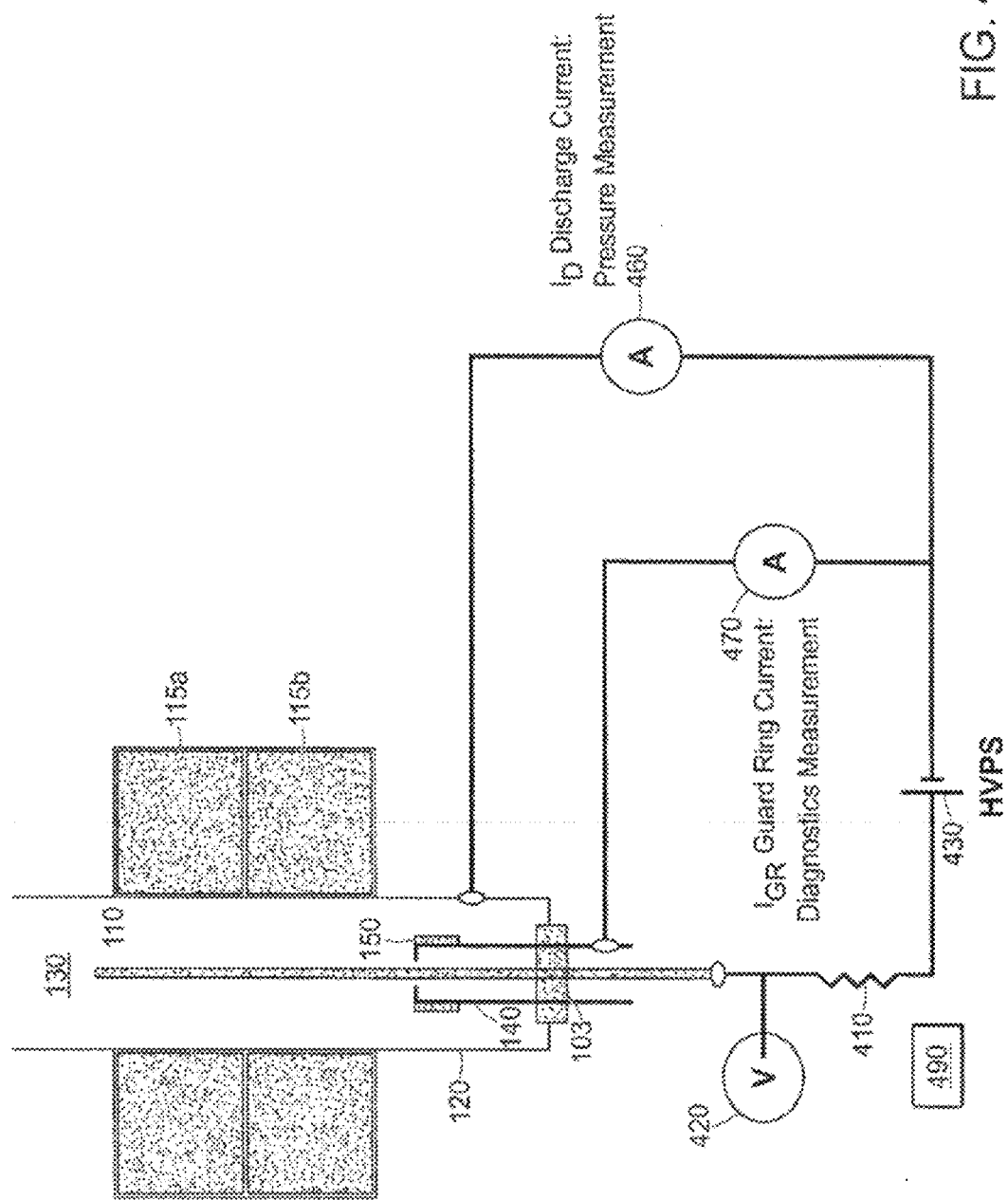
FIG. 4 is a schematic illustration of the discharge current and guard ring leakage current measurement circuits of a cold cathode ionization vacuum gauge.
Figure 5:
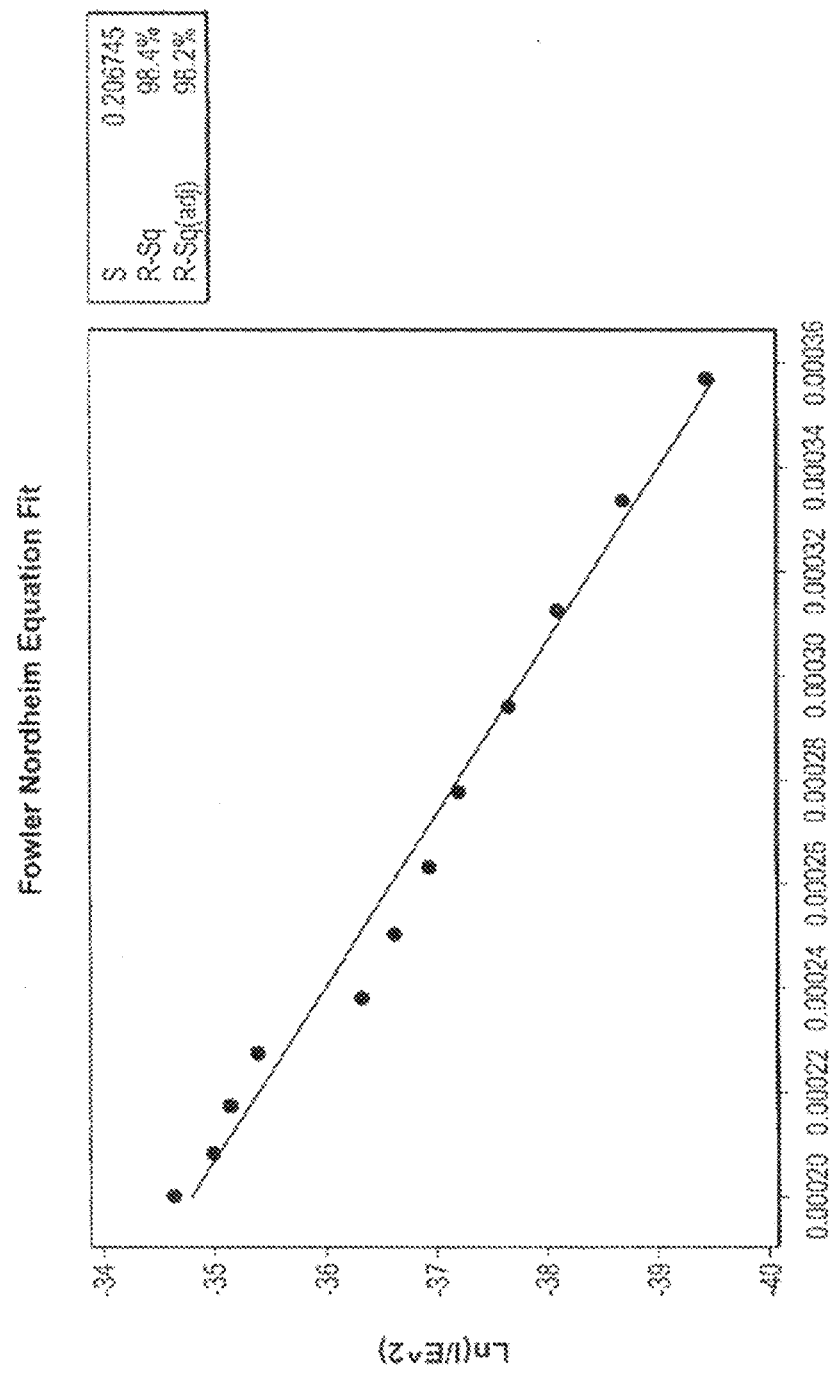
FIG. 5 is a graph of $\ln(I/E^2)$ as a function of $1/E$ demonstrating the fit of the data for a cold cathode ionization vacuum gauge to the Fowler Nordheim equation.

As shown in FIG. 4, an advantage of having the starter device 150 disposed over and electrically connected to the guard ring 140 is that the guard ring current IGR, which is the sum of the leakage current IL and the field emission current IFE (IGR=IL+IFE), is measured by ammeter 470 separately from the discharge current ID, which is measured by ammeter 460, from which the pressure is derived by a suitable calibration curve. The field emission current IFE can be calculated using the Fowler Nordheim equation $$I_{FE} = \frac{1.54 \times 10^6 A(\beta E)^2}{\varphi} e^{\left(-\frac{6.83 \times 10^3 \varphi^{3/2}}{\beta E}\right)} \quad (1)$$

where E is the electric field (MV/m), Φ is the work function of the material (eV), β is the field enhancement factor, and A is the effective emitting area (m2). As shown in FIG. 5, the graph of leakage current as a function of electric field shows a good fit to Eq. 1 and therefore demonstrates that there is field emission current from the guard ring starter device to the anode.

Figure 6A:
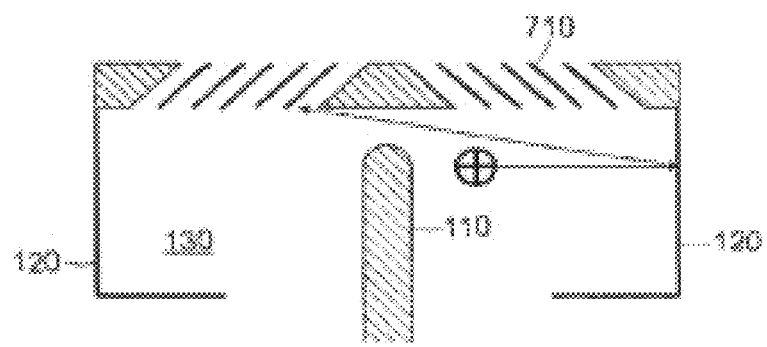
FIGS. 6A-6C are cross-sectional illustrations of three baffle designs for a cold cathode ionization vacuum gauge.
Figure 6B:
Figure 6C:
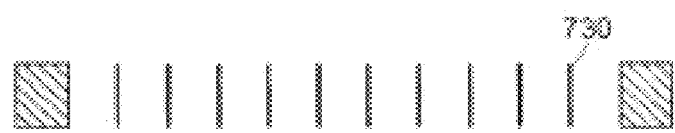
Figure 7:
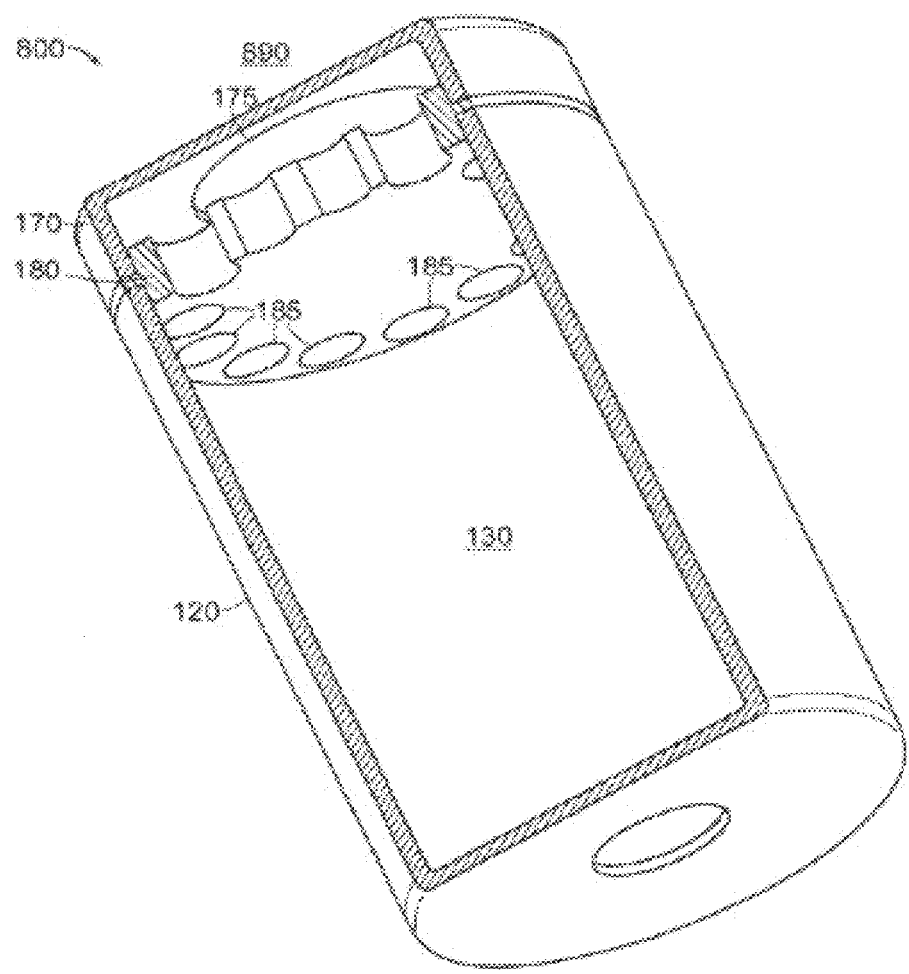
FIG. 7 is a cross-sectional perspective illustration of a baffle design having two partitions for a cold cathode ionization vacuum gauge.

Turning to FIGS. 6A-6C and 7, the cathode electrode of the cold cathode ionization vacuum gauge can have an opening to receive gas from a monitored chamber, and the vacuum gauge can further include a baffle across the opening of the cathode to limit flow of sputtered material to the chamber. The sputtered material results from erosion of the material of the cathode 120 by energetic impact between positive ions in the discharge volume 130 and the internal surface of the cathode 120, as shown in FIG. 6A. The baffle can be configured as a plurality of slots 710, chevrons 720, or holes 730 disposed at an angle with respect to the anode 110, as shown in FIGS. 6A-6C, respectively. The angle can be in a range of about 0 degrees, as shown in FIG. 6C, to about 60 degrees, such as about 45 degrees, as shown in FIG. 6A. Alternatively or additionally, the baffle 800 can be composed, as shown in FIG. 7, of at least two partitions 170 and 180, each partition having at least one aperture 175 in partition 170, and at least one aperture 185 (shown as a plurality of holes 185 in FIG. 7) in partition 180, the apertures of the partitions located out of a line of sight between a chamber 890 (not shown in detail) and the discharge volume 130. The partition 170 facing the chamber 890 allows gas to flow in and out through apertures (e.g., holes or slots) without substantially limiting gas conductance, provides an upper electrical boundary condition for the electric field, and provides shielding against the escape of sputtered material out of the cathode 120. The designs shown in FIGS. 6A-6C and 7 take advantage of the directionality of ejected sputtered materials to reduce the escape of sputtered material while still supporting high gas conductance. These designs can be considered to be baffles designed to stop material from escaping the CCIVG ionization area, but can also be considered baffles to stop materials coming from the process chamber into the ionization region 130. The common feature of these designs is a short profile with high gas conductivity and blind to line of sight contaminants. In that respect, these baffles are not limited to cold cathode ionization vacuum gauges, and can be used in a variety of vacuum gauge designs.

Figure 8:
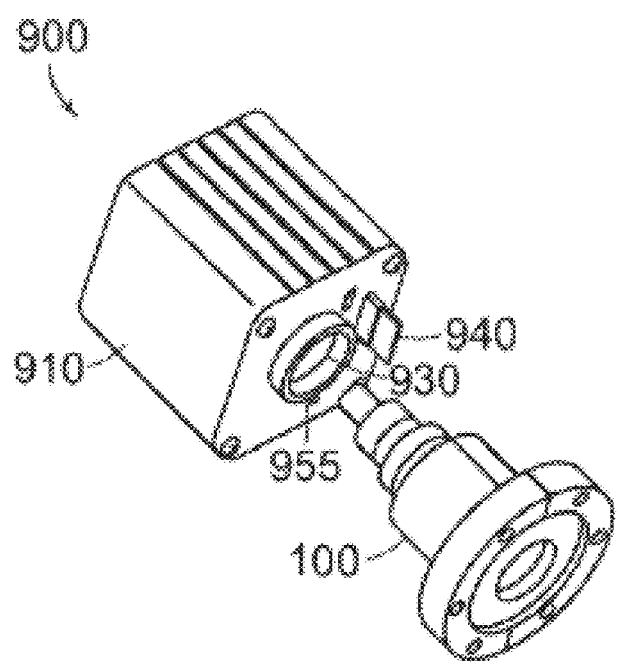
FIG. 8 is a perspective view of an electronics module and cold cathode ionization vacuum gauge prior to assembly.

The cold cathode ionization vacuum gauge described herein combines the best features of the commercially available vacuum gauges described above by including both an optional cable and an electronics module. As shown in FIG. 8, the vacuum gauge assembly 900 further includes an electronics module 910 configured to be directly coupled to the vacuum gauge 100 with an interface 930 complementary to the vacuum gauge 100, the module 910 housing electronics adapted to operate and read the vacuum gauge 100.

A cold cathode ionization vacuum gauge as described herein can be operated by setting a voltage potential difference to form an electrical discharge between the anode electrode and the cathode electrode, measuring a discharge impedance between the anode electrode and the cathode electrode, and deriving a pressure reading therefrom.

Turning back to FIG. 4, the limiting resistor 410 is placed between the anode electrode 110 and the high voltage power supply 430 (HVPS). The role of the limiting resistor 410 is to put an upper limit to the amount of discharge current that can flow through the discharge volume 130 and to extend the lifetime of the vacuum gauge. As a result of the limiting resistor 410, the actual high voltage bias present at the anode electrode 110 and measured by voltmeter 420 is generally smaller than the voltage delivered by the HVPS 430. In fact, the anode voltage decreases as the pressure increases, even though the output of the HVPS 430 remains constant at all pressures. In the vacuum gauge described herein, a 25 Megaohm (MΩ) limiting resistor 410 was selected to provide several advantages: 1. a safety limit to the amount of current the HVPS can deliver to an individual in case of accidental contact with internal HVPS components, 2. the choice of resistor moves pressure curve discontinuities into the higher pressure range above $1 \times 10^{-6}$ Torr, and 3. provides an upper limit for the discharge current of 125 µA. The cold cathode gauge controller 490 ensures that the output of the HVPS 430 is constant over the entire pressure range while at the same time continuously measures the anode voltage V with voltmeter 420 and discharge current ID with ammeter 460 to calculate discharge impedance Z as a function of pressure.

The operational viability of a cold cathode ionization vacuum gauge can be estimated by measuring a discharge current between the anode electrode and the cathode electrode, and deriving a pressure reading therefrom, recording the discharge current as a function of time, and integrating the discharge current over time to obtain a pressure dose for the vacuum gauge. Pressure dose as a measure of the effective lifetime of cold cathode ionization vacuum gauges was introduced by Wilfert and Schindler in 2004. See St. Wilfert and N. Schindler, Applied Physics A vol. 78, pp. 993-666 and 691-694 (2004). Wilfert and Schindler integrated the measured pressure over time to obtain the pressure dose PD(T) according to the expression $$PD(T) = \int_0^T P(t)dt \quad (2)$$

where P(t) is the pressure measured at time t, and T is the elapsed time (hours) since the beginning of measurements. They concluded that a cold cathode ionization vacuum gauge operated in a typical residual gas environment has an accuracy degradation in a range of about 10% to about 30% after a pressure dose of 1.1 mbar*h.

Integrating the measured pressure is not suitable at high pressures for cold cathode ionization vacuum gauges that have limiting resistors, because, as discussed above, for such vacuum gauges the pressure is not directly related to the discharge current, and it is more likely that the discharge current is responsible for the accuracy degradation of the gauge due to sputtering of the cathode. The pressure dose expression converted to discharge current is $$PD(T) = \int_0^T I_D(t)dt \quad (3)$$

where ID(t) is the discharge current at time t, and T is the elapsed time since the beginning of measurements. The Wilfert and Schindler 1.1 mbar*h converts to an integrated charge of about 3,600 Coulombs.

The method can further include recording and integrating a gas factor as a function of time, to account for gas species dependent sputtering rates, using the expression $$PD(T) = \int_0^T G(t)I_D(t)dt \quad (4)$$

where G(t) is a gas species factor at time t (default is equal to 1 for nitrogen), ID(t) is the discharge current at time t, and T is the elapsed time since the beginning of measurements.

Figure 9:
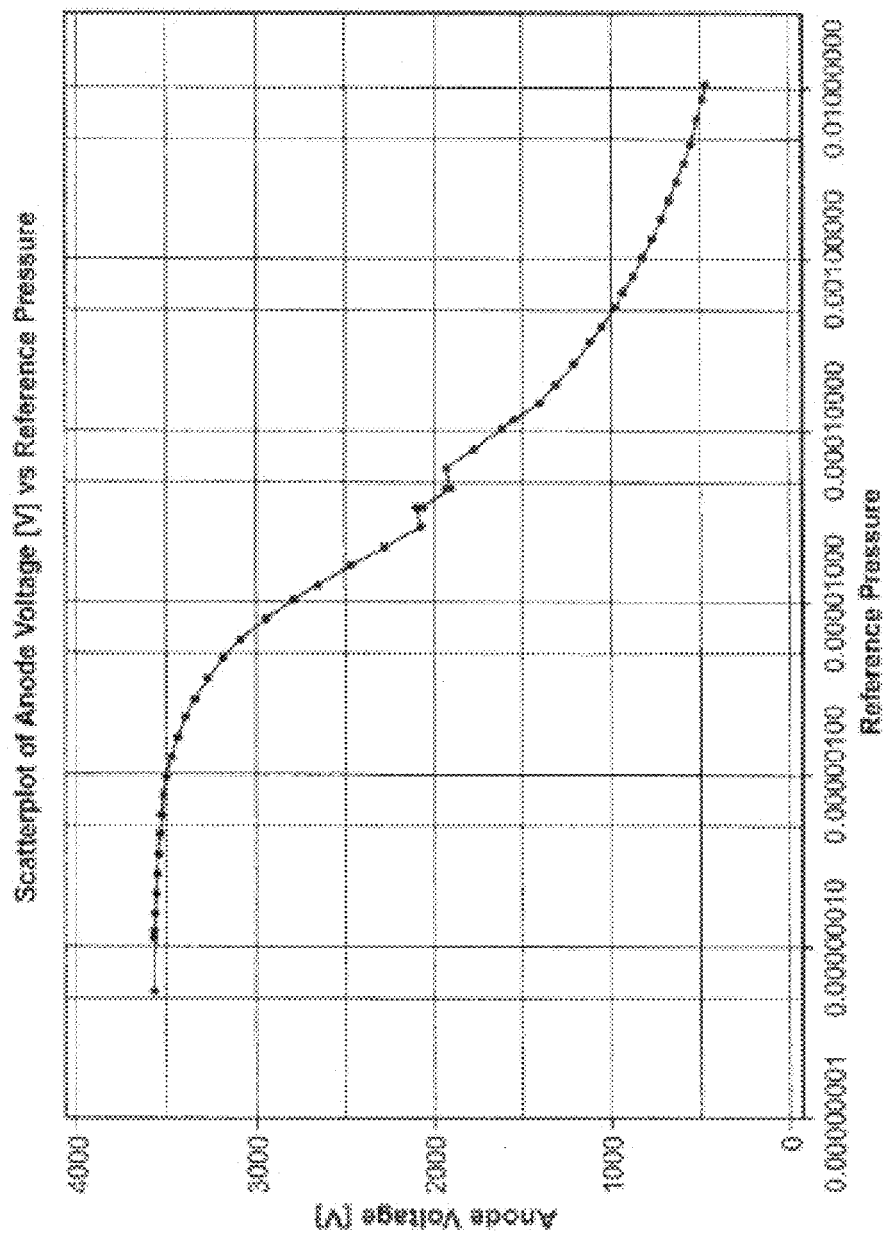
FIG. 9 is a graph of anode voltage (volts) as a function of pressure (Torr) for a cold cathode ionization vacuum gauge.

The method can further include recording and integrating an ion energy factor as a function of time, because the ion energy is likely to affect the sputtering rate of the cathode. The integration over time of the sputtering rate provides a closer approximation of the pressure dose. The sputtering rate depends on the discharge current (i.e., the number of ions hitting the cathode per unit time) and it is weighted by the gas species and the energy of the ions reaching the cathode. An energy factor is therefore introduced to account for the fact that the energy of the ions depends on the pressure (i.e., the anode voltage changes with pressure, due to the limiting resistor discussed above). The expression including the energy factor is $$PD(T) = \int_0^T E(t)G(t)I_D(t)dt \quad (5)$$

where E(t) is the energy factor at time t, G(t) is a gas species factor at time t (default is equal to 1 for nitrogen), ID(t) is the discharge current at time t, and T is the elapsed time since the beginning of measurements. The energy factor is higher at lower pressures and lower at higher pressures where the anode voltage decreases relative to the high voltage power supply output (see FIG. 9).

Failure Mode Testing

The inventors have identified an electrical discharge mode that contributes to inaccuracies in CCIVG measurements. In the course of long term failure mode testing, the inventors observed that gauges became inaccurate more rapidly than anticipated. In some cases, the CCIVG failed after only 10% of the expected lifetime.

Figure 10A:
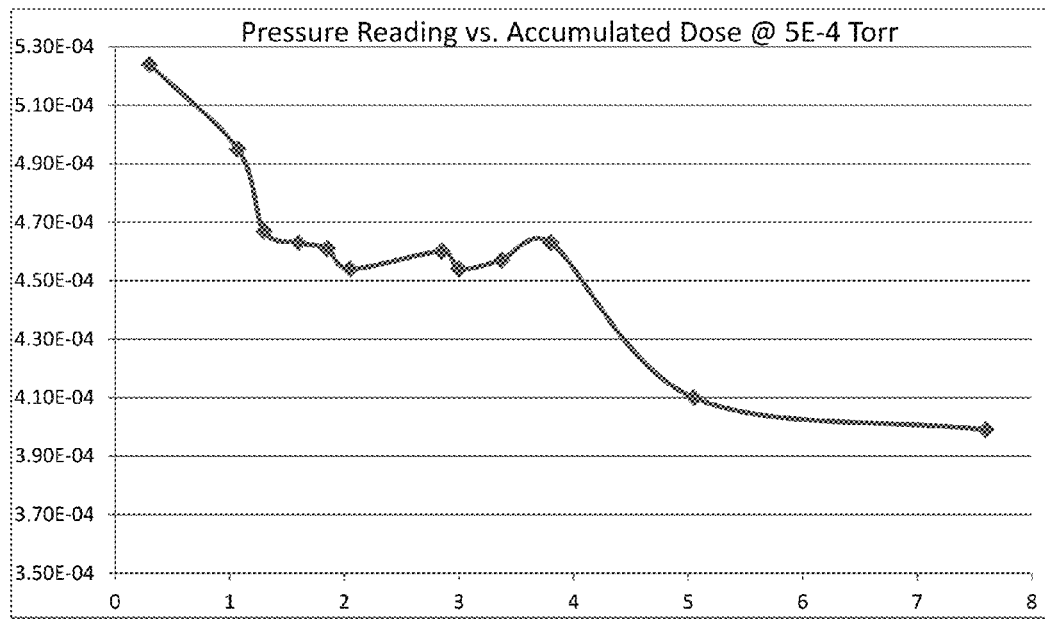
FIG. 10A is a graph showing pressure reading vs. accumulated dose as a percentage of maximum dose for an anode electrode in a long term failure mode test.

As an example, the inventors used the dose calculation of Formula (3) with an assumed dose of 3600 coulombs of charged ions impacting the catheter. Assuming that nitrogen ions are impacting the catheter, the maximum dose corresponds to 3 grams of material sputtered from a stainless steel cathode, which corresponds to the removal of a layer of sputtered material having a depth of approximately 0.005 inches. At the pressure used to perform long term studies, approximately $4 \times 10^{-4}$ Torr and 100 microamps of discharge current, it would take 416 days to achieve a full dose. FIG. 10A is a graph showing the loss of sensitivity of a gauge over time. The x-axis corresponds to dose calculated as percentage of total dose. For example, at a dose of 5%, the gauge has accumulated a discharge current of 180 coulombs (i.e., 5% of 3600 coulombs). At a 5% dose, the pressure reading dropped by 20% under the test conditions. Additionally, the pressure reading suffered from a 20% loss of sensitivity at approximately a 3% dose.

Through careful observation, the inventors detected the accumulation of material on the starter device and baffle structure. Since the CCIVG is typically loaded with a nominal calibration curve at the time of manufacture, this material accumulation was postulated as a factor contributing to reduced time-to-time repeatability and gauge-to-gauge reproducibility. In other words, the accumulation of material inside the CCIVG could be an indication of changes in the electrical discharge patterns, thereby reducing the accuracy of the measured pressure.

While the inventors observed the accumulation of material within the CCIVG, the source of the material and the mechanism leading to its accumulation were unknown. Many potential causes of the problem were investigated. For example, the inventors suspected that the material could have been coming up from a lower portion of the gauge, such as the starter. In order to determine the source, the inventors analyzed the deposits by Scanning Electron Microscopy and energy dispersive X-ray spectroscopy. Those results indicated that the material building on the internal surface of the baffle was stainless steel originating from the tip of the anode post. The inventors also performed microscopic analysis of the deposits, which indicated that enough material was being removed from the tip of the anode to produce a visible depression in the anode tip (i.e., a crater).

Most discussion in the literature describes electrical discharge between the anode electrode and the cathode electrode. However, discharge from the anode electrode tip to the baffle structure, which is generally in an axial direction, was not previously recognized as a discharge mode in a CCIVG. However, the inventors hypothesized that the accumulation of material was caused by an uncontrolled electrical discharge between the anode electrode tip and the baffle structure, an electrical discharge mode that had not been previously identified. In other words, the inventors hypothesized that the material was transferred from the anode tip to the baffle due to a sputter mechanism. When high energy electrons reach the tip of the anode, they remove material by sputtering components from the tip. The sputtered material is ejected from the tip of the anode at high energy and reaches the baffle surface, which is in direct line of sight.

In a first experiment, three gauges were tested for discharge between the anode electrode and the baffle. Gauges A and B did not have significant discharge between the anode electrode and the baffle, but Gauge C did. The gauges were tested at a reference pressure of $4.3 \times 10^{-4}$ Torr, and Table 1 shows the result of this first experiment.

TABLE 1

| Gauge ID | Discharge Current (A) | Pressure Reading (nominal cal), accuracy |
|---|---|---|
| A | 1.03E-4 | 3.84E-4, −12% |
| B | 1.04E-4 | 4.74E-4, +9% |
| C (Axial Discharge present) | 1.09E-4 (+5 microA) | 8.23E-4, 91% |

Gauges A and B, which did not exhibit axial discharge between the anode electrode and the baffle structure, indicated a pressure within +/−30% accuracy. However, Gauge C indicated a pressure that was inaccurate by 91%. The axial discharge contributes an additional 5 microA to the discharge current, and causes a significant error in the indicated pressure when measured in the range of $10^{-4}$ Torr. Gauge C exhibited fast failures due to the presence of the discharge between the anode electrode and the baffle structure and the fast accumulation of material on the baffle structure that eventually peeled off and electrically shorted the gauge.

Once a mechanism was identified for the material transfer process, the inventors investigated a variety of potential solutions aimed at eliminating uncontrolled electrical discharge between the anode tip and the internal surface of the baffle.

Figure 11:
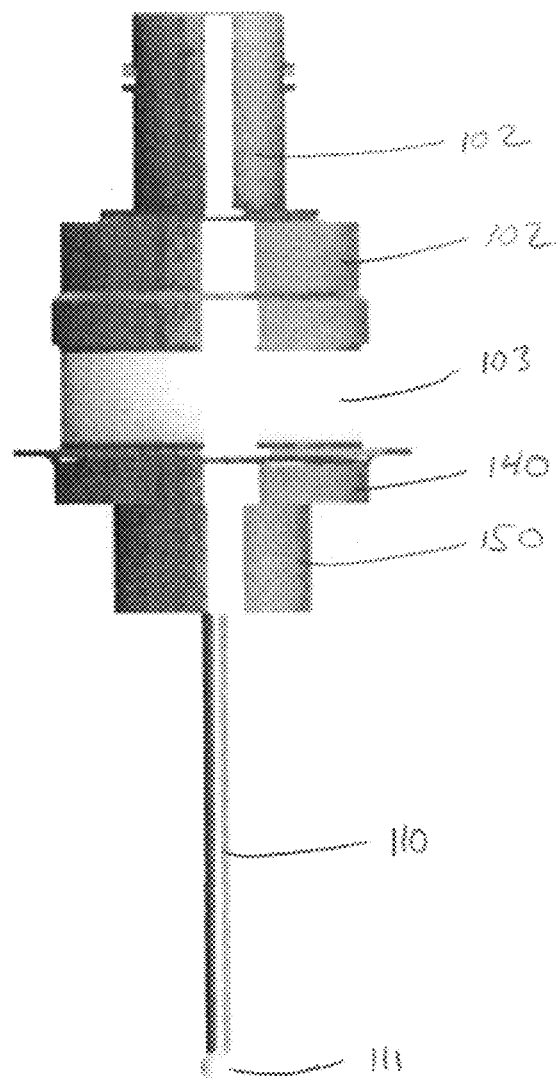
FIG. 11 is an illustration of an anode electrode of a cold cathode ionization vacuum gauge.

In one embodiment illustrated in FIG. 11, the inventors affixed an anode electrode tip 111 to the anode electrode 110. Preferably, the tip has a rounded exterior and a diameter greater than the anode electrode. The tip can be made of a metal. Preferably, the tip can be made of an electrically nonconductive material or coated with an electrically nonconductive material. For example, the electrically nonconductive material can be a ceramic. Other nonconductive materials are also suitable. Additionally, the baffle structure can be made of an electrically nonconductive material or coated with an electrically nonconductive material, such as an electrically nonconductive ceramic. Additionally, one of skill in the art will understand that the term "nonconductive" does not mean that absolutely no conductivity occurs. Rather, it refers to materials that have minimal conductivity, which are typically non-metals. Without wishing to be bound by theory, it is believed that the rounded exterior of the tip, which is greater in diameter than the anode electrode, does not allow charge to accumulate at a small point, thereby decreasing uncontrolled discharge and the deposition of sputtered material.

Figure 12A:
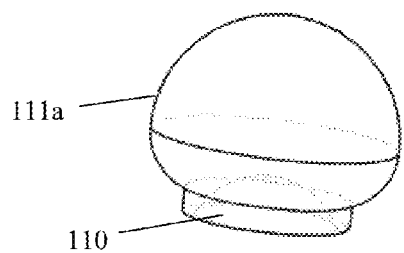
FIG. 12A is a schematic view of a dome-shaped anode electrode tip.
Figure 12B:
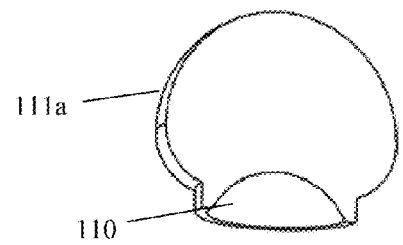
FIG. 12B is a cross-section of a dome-shaped anode electrode tip.
Figure 12C:
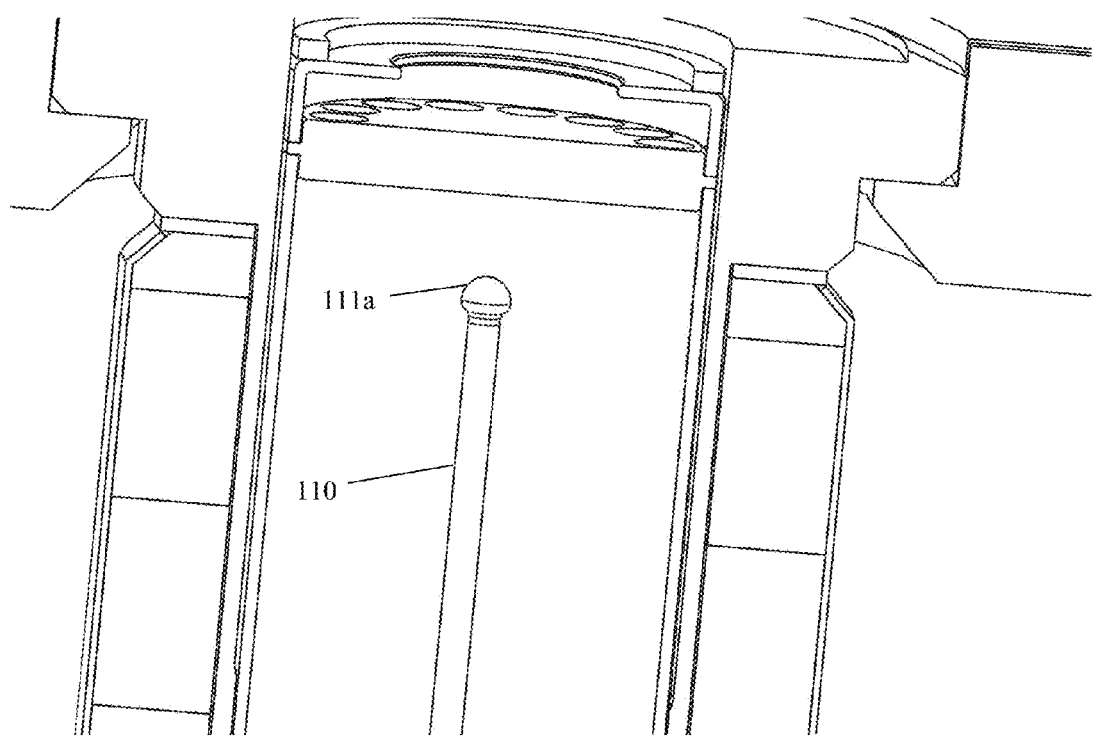
FIG. 12C is a schematic view of an anode electrode having a dome-shaped tip in a CCIVG.

FIGS. 12A-C illustrates a dome-shaped tip 111a that can be attached to an electrode. As illustrated, the anode electrode 110 has a dome shaped tip 111a that is larger in diameter than the anode electrode 110. FIG. 12C illustrates the anode electrode inserted into a CCIVG.

Figure 13A:
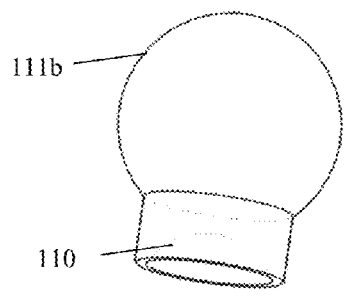
FIG. 13A is a schematic view of a sphere-shaped anode electrode tip.
Figure 13B:
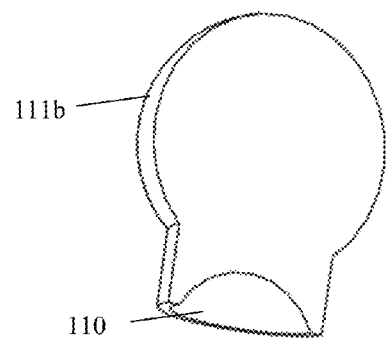
FIG. 13B is a cross-section of a sphere-shaped anode electrode tip.
Figure 13C:
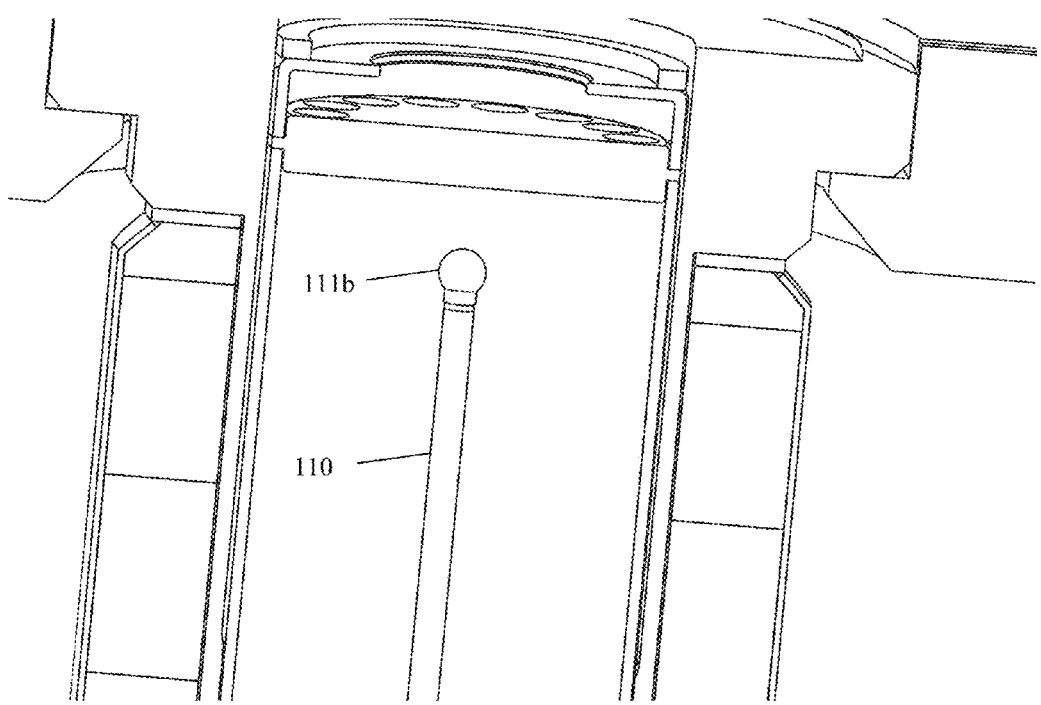
FIG. 13C is a schematic view of an anode electrode having a sphere-shaped tip in a CCIVG.

FIGS. 13A-C illustrate a sphere-shaped tip 111b can be attached to an electrode. As illustrated, the anode electrode 110 has a sphere-shaped tip 111b that is larger in diameter than the anode electrode 110. FIG. 13C illustrates the anode electrode inserted into a CCIVG.

The anode electrode 110 and anode electrode tips 111a and 111b can be manufactured by machining down the size of the anode electrode 110 so that a larger anode electrode tip 111a or 111b remains. Alternatively, the anode electrode tips 111a and 111b can be manufactured separately from the anode electrode and subsequently affixed to the anode electrode 110.

Figure 14A:
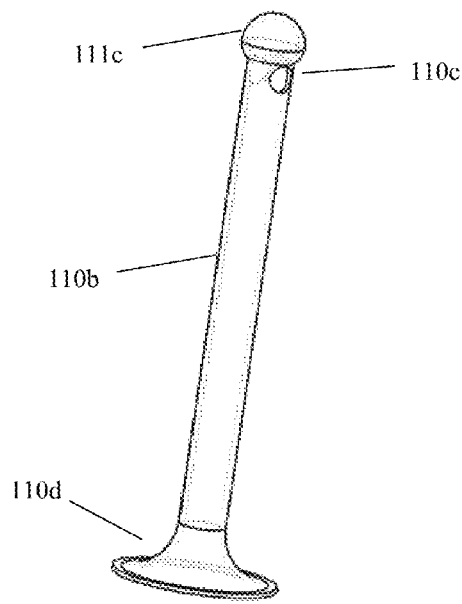
FIG. 14A is a schematic view of an anode electrode sleeve having a dome-shaped tip.
Figure 14B:
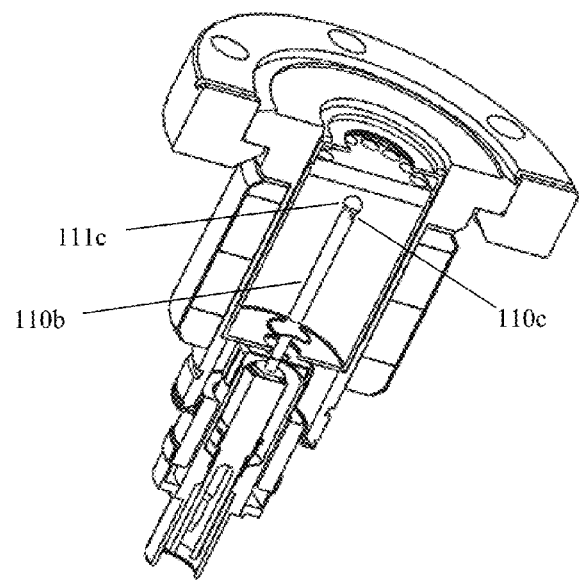
FIG. 14B is a schematic view of an anode electrode having a sleeve with a dome-shaped tip in a CCIVG.
Figure 14C:
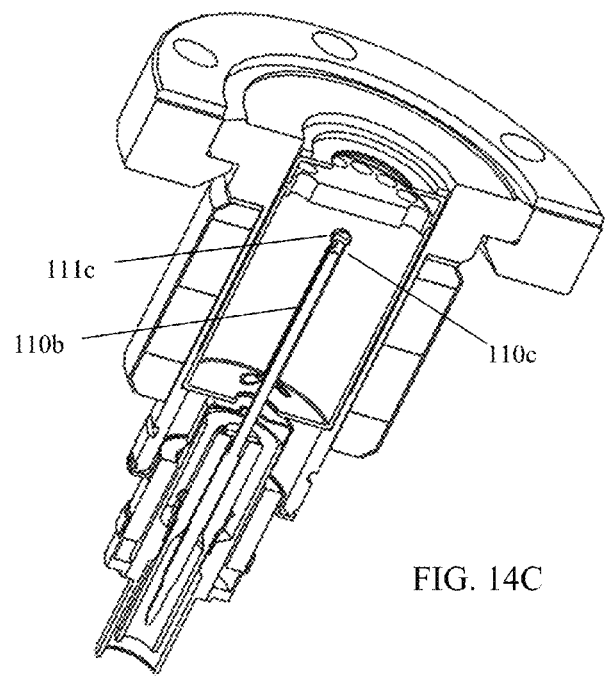
FIG. 14C is a cross section of an anode electrode having a sleeve with a dome-shaped tip in a CCIVG.

In other embodiments, the CCIVG can include an anode sleeve 110b having a tip. FIGS. 14A-C illustrate an anode electrode sleeve 110b having a dome-shaped tip 111c, and FIGS. 15A-C illustrate an anode electrode sleeve 110b having a sphere-shaped tip 111d.

In some embodiments, the axially directed tip of the anode electrode has a rounded exterior with a diameter at least 10% greater than the diameter of the anode electrode. In other embodiments, the axially directed tip of the anode electrode has a rounded exterior with a diameter at least 20% greater than the diameter of the anode electrode. In other embodiments, the axially directed tip of the anode electrode has a rounded exterior with a diameter at least 50% greater than the diameter of the anode electrode. In one embodiment, the anode electrode has a diameter of about 0.062 inches and the axially directed tip is substantially spherical and has a diameter of about 0.094 inches. The anode electrode can have a diameter between about 0.04 inches and about 0.125 inches. As used herein, the terms anode electrode tip and axially directed tip of an anode electrode refer to the tip portion 111 of an anode electrode 110, with or without an anode sleeve 110b. Thus, where an anode electrode has a sleeve, the diameter of the anode electrode includes the diameter of the sleeve. In some embodiments, electrical discharge occurs substantially entirely between the anode electrode and the cathode electrode with substantially no electrical discharge between the anode electrode tip of the anode electrode or sleeve and the baffle structure.

Reducing discharge between the anode electrode tip and the baffle structure provides a number of advantages. First, reducing discharge can reduce the accumulation of sputtered deposits within the CCIVG that can eventually lead to failures due to electrical shorts. These sputtered deposits can short the gauge, so eliminating them can improve the functioning of the gauge. Reducing discharge can also improve the accuracy of the gauge since a small additional amount of current due to the discharge can represent a large error in the pressure measurement, which is particularly true for pressures above $1 \times 10^{-4}$ Torr. Additionally, reducing discharge can reduce discontinuities in the pressure sensitivity curve and can improve time-to-time repeatability and gauge-to-gauge reproducibility. Reducing discharge can also improve the lifespan of the CCIVG by reducing the incidence of premature gauge failures.

Figure 10B:
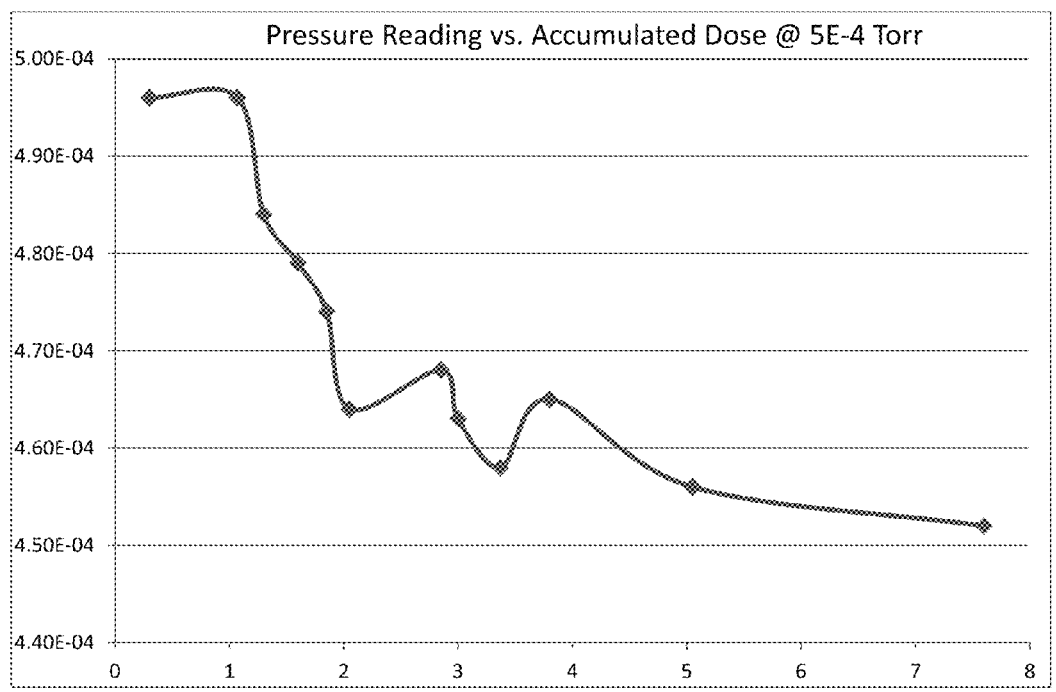
FIG. 10B is a graph showing pressure reading vs. accumulated dose as a percentage of maximum dose for an anode electrode having a dome-shaped tip in a long term failure mode test.

FIG. 10B is a graph showing pressure reading vs. accumulated dose as a percentage of maximum dose for an anode electrode having a dome-shaped tip a long term failure mode test. As illustrated, the anode electrode has a 10% decrease in sensitivity after approximately an 8% dose. Thus, the tip structure substantially improves the lifetime of the CCIVG.

In a second experiment, the same three Gauges A, B, and C were tested again. However, a dome-shaped tip having a diameter of about 0.125 inches with a thickness of about 0.030 inches was added to the anode electrode of Gauge C. The gauges were tested at a reference pressure of $4.4 \times 10^{-4}$ Torr, and the results are shown in Table 2.

TABLE 2

| Gauge ID | Discharge Current (A) | Pressure Reading (nominal cal), accuracy |
|---|---|---|
| A | 1.06E-4 | 4.57E-4, 4% |
| B | 1.06E-4 | 5.58E-4, 27% |
| C (Axial Discharge present) | 1.05E-4 | 5.77E-4, 30% |

All three gauges indicate a pressure close to others and within +/−30% accuracy. Since the reference pressure is slightly higher for the second experiment, the overall currents were larger than in the first experiment. As shown in Table 2, the gauge-to-gauge current readings are more consistent. Additionally, material does not build up on the baffle plate in Gauge C. When mounted on a long-term test system, Gauge C did not develop thick coatings on the baffle structure.

In a third experiment, the amount of current generated by discharge between the anode tip and the baffle surface facing the anode tip was determined. The anode electrode of Gauge C was almost entirely coated with an alumina sleeve and placed into the CCIVG. The gauges were tested at a reference pressure of $4.5 \times 10^{-4}$ Torr, and the results are shown in Table 3.

TABLE 3

| Gauge ID | Discharge Current (A) |
|---|---|
| A | 1.07E−4 |
| B | 1.06E−4 |
| C (Axial Discharge present) | 2.8E−5 |

The third experiment suggests that 28 microA of discharge occurs between the anode electrode and the baffle structure, which is in line with the 5 microA measured in Experiment 1 as the difference between the Gauge C, which has discharge between the anode electrode and baffle, and Gauges A and B, which do not have discharge between the anode structure and baffle.

Discontinuity Analysis

Figure 16:
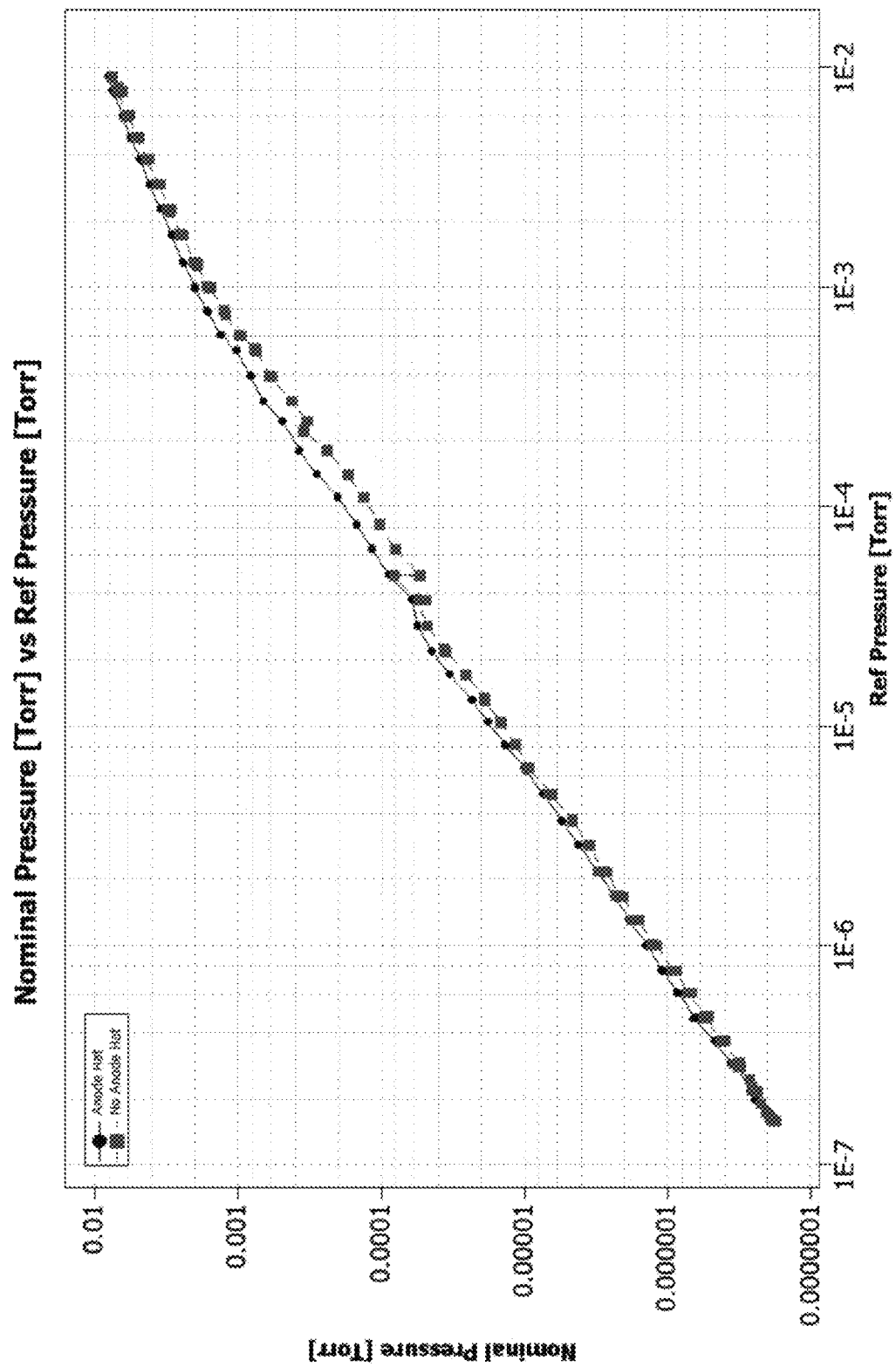
FIG. 16 is a calibration curve for a CCIVG with and without a dome-shaped anode electrode tip.

An ideal calibration curve for a CCIVG should not include any discontinuities or sharp changes in the curve. Reducing discontinuities in the calibration curve improves the accuracy of the CCIVG pressure measurement. FIG. 16 is a calibration curve for a CCIVG showing the Impedance vs. Pressure under two different conditions. In a first experiment, a calibration curve was created for an anode electrode that does not have an axially directed tip with a rounded exterior having a diameter greater than the diameter of the anode electrode was used. In a second experiment, a calibration curve was created for an anode having a domed-shaped tip (a "hat") made out of a disk rounded with a DREMEL tool so that it had a diameter of about 0.125 inches and a height of about 0.030 inches.

In the first experiment, the standard anode showed a discontinuity between $1 \times 10^{-5}$ Torr and $1 \times 10^{-4}$ Torr. In the second experiment, the anode with the dome-shaped tip did not have the same magnitude of discontinuity. The results suggests that a modal change in the discharge was eliminated by adding the dome-shaped tip.

Figure 17:
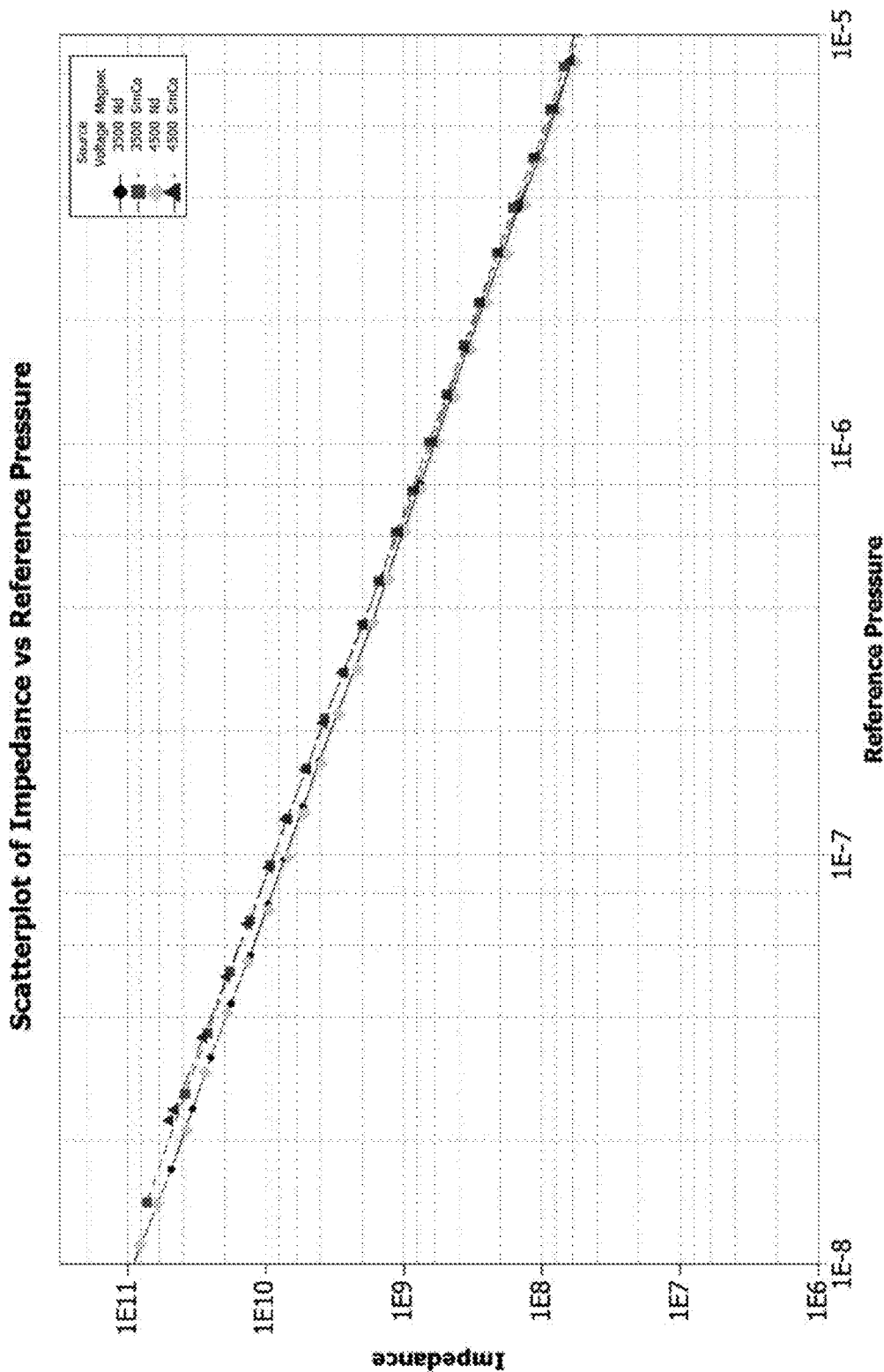
FIG. 17 is a plot of impedance vs. reference pressure under different voltages and magnetic fields.

Discharge impedance can be used as an indicator of pressure because the impedance does not depend heavily on the selection of anode voltage selection or magnetic field amplitude. The impedance can be measured as the ratio of the anode voltage to the anode discharge current. Due to the guard ring, the anode electrode current is largely unaffected by leakage current. As shown in FIG. 17, the impedance curves for a CCIVG under different voltages and magnetic fields are similar. Notably, the impedance curve did not change significantly when a SmCo (1.35 kGauss) or a Nd (1.65 kGauss) magnet was used. Additionally, it did not change significantly when the anode voltage was changed from 3500 to 4500V. In other words, there is greater flexibility in the choice of magnet and operating voltage. Another advantage of measuring impedance is that impedance remains sensitive to pressure over a larger pressure range than anode voltage or anode current measurements alone.

INCORPORATION BY REFERENCE AND EQUIVALENTS

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A cold cathode ionization vacuum gauge comprising:
    an extended anode electrode having an axially directed tip;
    a cathode electrode surrounding the anode electrode along at least a portion of its length and forming a discharge space between the anode electrode and the cathode electrode; and
    a baffle structure facing the axially directed anode electrode tip of the anode electrode,
    the axially directed tip of the anode electrode having a rounded exterior with a diameter greater than the diameter of the anode electrode.

2. The cold cathode ionization vacuum gauge of claim 1, wherein the anode electrode comprises a sleeve.

3. The cold cathode ionization vacuum gauge of claim 1, wherein the axially directed tip of the anode electrode is at least 10% greater than the diameter of the anode electrode.

4. The cold cathode ionization vacuum gauge of claim 1, wherein the axially directed tip of the anode electrode is at least 20% greater than the diameter of the anode electrode.

5. The cold cathode ionization vacuum gauge of claim 1, wherein the axially directed tip of the anode electrode is at least 50% greater than the diameter of the anode electrode.

6. The cold cathode ionization vacuum gauge of claim 1, wherein the anode electrode has a diameter of about 0.062 inches and the axially directed tip has a diameter of about 0.094 inches.

7. The cold cathode ionization vacuum gauge of claim 1, wherein the baffle structure has an electrically nonconductive surface that minimizes discharge between the anode electrode tip and the baffle structure.

8. The cold cathode ionization vacuum gauge of claim 7, wherein the baffle structure is ceramic.

9. The cold cathode ionization vacuum gauge of claim 7, wherein the baffle structure is coated with a ceramic.

10. The cold cathode ionization vacuum gauge of claim 1, wherein the anode electrode tip has a substantially dome-shaped exterior.

11. The cold cathode ionization vacuum gauge of claim 1, wherein the anode electrode tip has a substantially spherical exterior.

12. The cold cathode ionization vacuum gauge of claim 1, wherein there is no electrical discharge between the anode electrode tip and the baffle.

13. The cold cathode ionization vacuum gauge of claim 1, wherein anode electrode tip has an electrically nonconductive surface that minimizes discharge between the anode electrode tip and the baffle structure.

14. The cold cathode ionization vacuum gauge of claim 13, wherein the anode electrode tip is ceramic.

15. The cold cathode ionization vacuum gauge of claim 13, wherein the anode electrode tip is coated with a ceramic.

16. A method of minimizing electrical discharge between an anode electrode and a baffle structure in a cold cathode ionization vacuum gauge comprising:
    providing an anode electrode tip to an extended anode electrode of a cold cathode ionization vacuum gauge, the anode electrode tip having a rounded exterior with a diameter greater than the diameter of the anode electrode.

17. The method of claim 16, wherein the anode electrode tip comprises a tip portion of an anode electrode sleeve.

18. The method of claim 16, wherein the axially directed tip of the anode electrode is at least 10% greater than the diameter of the anode electrode.

19. The method of claim 16, wherein the axially directed tip of the anode electrode is at least 20% greater than the diameter of the anode electrode.

20. The method of claim 16, wherein the axially directed tip of the anode electrode is at least 50% greater than the diameter of the anode electrode.

21. The method of claim 16, wherein the anode electrode has a diameter of about 0.062 inches and the axially directed tip has a diameter of about 0.094 inches.

22. The method of claim 16, wherein the anode electrode tip has a substantially dome-shaped exterior.

23. The method of claim 16, wherein the anode electrode tip has a substantially spherical exterior.

24. The method of claim 16, wherein the anode electrode tip has an electrically nonconductive surface.

25. The cold cathode ionization vacuum gauge of claim 24, wherein the anode electrode tip is ceramic.

26. The cold cathode ionization vacuum gauge of claim 24, wherein the anode electrode tip is coated with a ceramic.

\* \* \* \* \*